(12) United States Patent
Kim et al.

(10) Patent No.: US 12,477,668 B2
(45) Date of Patent: Nov. 18, 2025

(54) BUTTON DEVICE AND ELECTRONIC DEVICE COMPRISING SAME

(71) Applicant: Samsung Electronics Co., Ltd., Suwon-si (KR)

(72) Inventors: Sungjun Kim, Suwon-si (KR); Donghee Kim, Suwon-si (KR); Changok Lim, Suwon-si (KR); Youngkyu Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 259 days.

(21) Appl. No.: 18/469,018

(22) Filed: Sep. 18, 2023

(65) Prior Publication Data

US 2024/0008196 A1 Jan. 4, 2024

Related U.S. Application Data

(63) Continuation of application No. PCT/KR2022/003833, filed on Mar. 18, 2022.

(30) Foreign Application Priority Data

Mar. 24, 2021 (KR) .......................... 10-2021-0037949

(51) Int. Cl.
*H05K 5/00* (2025.01)
*H01H 13/06* (2006.01)
(Continued)

(52) U.S. Cl.
CPC ......... *H05K 5/0214* (2022.08); *H01H 13/063* (2013.01); *H01H 23/065* (2013.01); *H05K 5/061* (2013.01)

(58) Field of Classification Search
CPC .... H05K 5/0214; H05K 5/061; H01H 13/063; H01H 23/065
(Continued)

(56) References Cited

U.S. PATENT DOCUMENTS 9,780,827 B2 * 10/2017 Shukla ................. H04M 1/236
9,818,556 B2 * 11/2017 Chen ....................... H04M 1/18
(Continued)

FOREIGN PATENT DOCUMENTS

JP 2013-058918 A 3/2013
KR 10-0457089 B1 11/2004
(Continued)

OTHER PUBLICATIONS

Extended European Search Report dated Jul. 4, 2024; European Appln. No. 22775995.8-1218 / 4297383 PCT/KR2022003833.
(Continued)

*Primary Examiner* — Zhengfu J Feng
(74) *Attorney, Agent, or Firm* — Jefferson IP Law, LLP

(57) ABSTRACT

An electronic device is provided that includes a housing including a key hole and a vent hole, a button member including a body part disposed to cover the key hole and the vent hole, and a button protrusion inserted into the key hole, a substrate member including a switch actuated based on the button protrusion, a base disposed between the housing and the substrate member to cover the substrate member, a waterproof member including a sealing part, formed to protrude from the base to surround a perimeter at least one of the key hole and the vent hole, which has at least a part in close contact with the outer wall, a conduit for connecting an internal space and outside of the electronic device through the vent hole, and a waterproof cover disposed on the conduit so as to block moisture flowing in through the vent hole.

18 Claims, 16 Drawing Sheets

(51) Int. Cl.
*H01H 23/06* (2006.01)
*H05K 5/02* (2006.01)
*H05K 5/06* (2006.01)

(58) Field of Classification Search
USPC ......................................................... 361/709
See application file for complete search history.

(56) References Cited

U.S. PATENT DOCUMENTS

| | | | |
|---|---|---|---|
| 10,215,742 B2 | 2/2019 | Choi et al. | |
| 10,491,728 B2* | 11/2019 | Jo | H04M 1/0254 |
| 10,503,221 B2* | 12/2019 | Cha | H04M 1/0202 |
| 10,910,170 B2 | 2/2021 | Choi et al. | |
| 11,202,385 B2* | 12/2021 | Kim | H05K 1/189 |
| 2015/0114090 A1* | 4/2015 | Fukuda | F21V 33/0052 |
| | | | 362/253 |
| 2015/0219608 A1* | 8/2015 | Choi | G01N 33/0009 |
| | | | 73/23.2 |
| 2017/0251564 A1* | 8/2017 | Jun | H05K 5/069 |
| 2019/0080860 A1* | 3/2019 | Choi | H04M 1/236 |
| 2019/0096603 A1* | 3/2019 | Thome | H04M 1/236 |

FOREIGN PATENT DOCUMENTS

| | | | |
|---|---|---|---|
| KR | 10-0584911 B1 | 6/2006 |
| KR | 10-0927835 B1 | 11/2009 |
| KR | 10-1208218 B1 | 12/2012 |
| KR | 20-2013-0002664 U | 5/2013 |
| KR | 10-2015-0092579 A | 8/2015 |
| KR | 10-2017-0045090 A | 4/2017 |
| KR | 10-1726222 B1 | 4/2017 |
| KR | 10-2017-0100368 A | 9/2017 |
| KR | 10-1951687 B1 | 2/2019 |
| KR | 10-2008212 B1 | 8/2019 |
| KR | 10-2019-0109847 A | 9/2019 |
| KR | 10-2020-0046628 A | 5/2020 |

OTHER PUBLICATIONS

Korean Office Action with English translation dated Apr. 7, 2025; Korean Appln. No. 10-2021-0037949.
International Search Report with Written Opinion dated Jun. 28, 2022; International Appln. No. PCT/KR2022/003833.

* cited by examiner

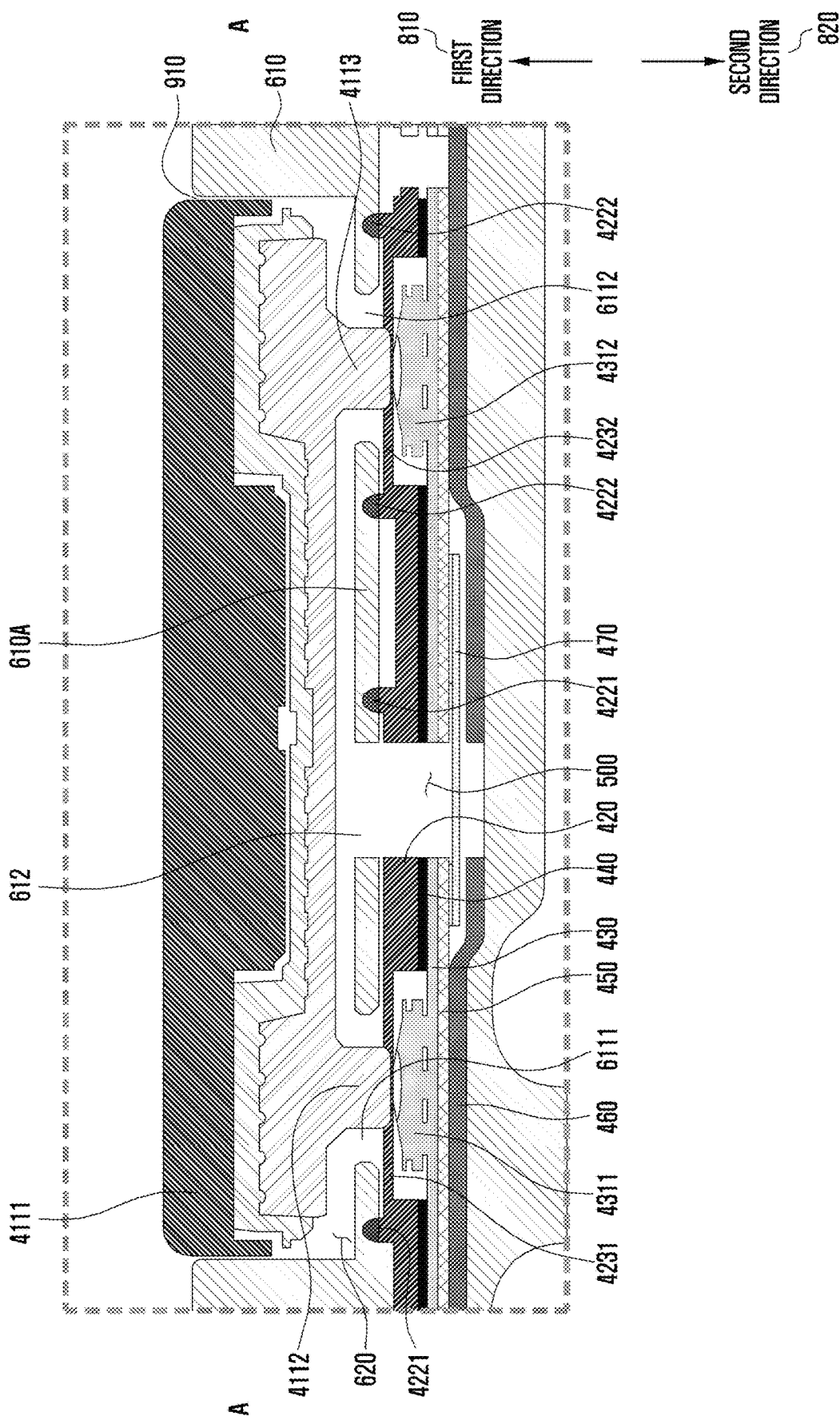

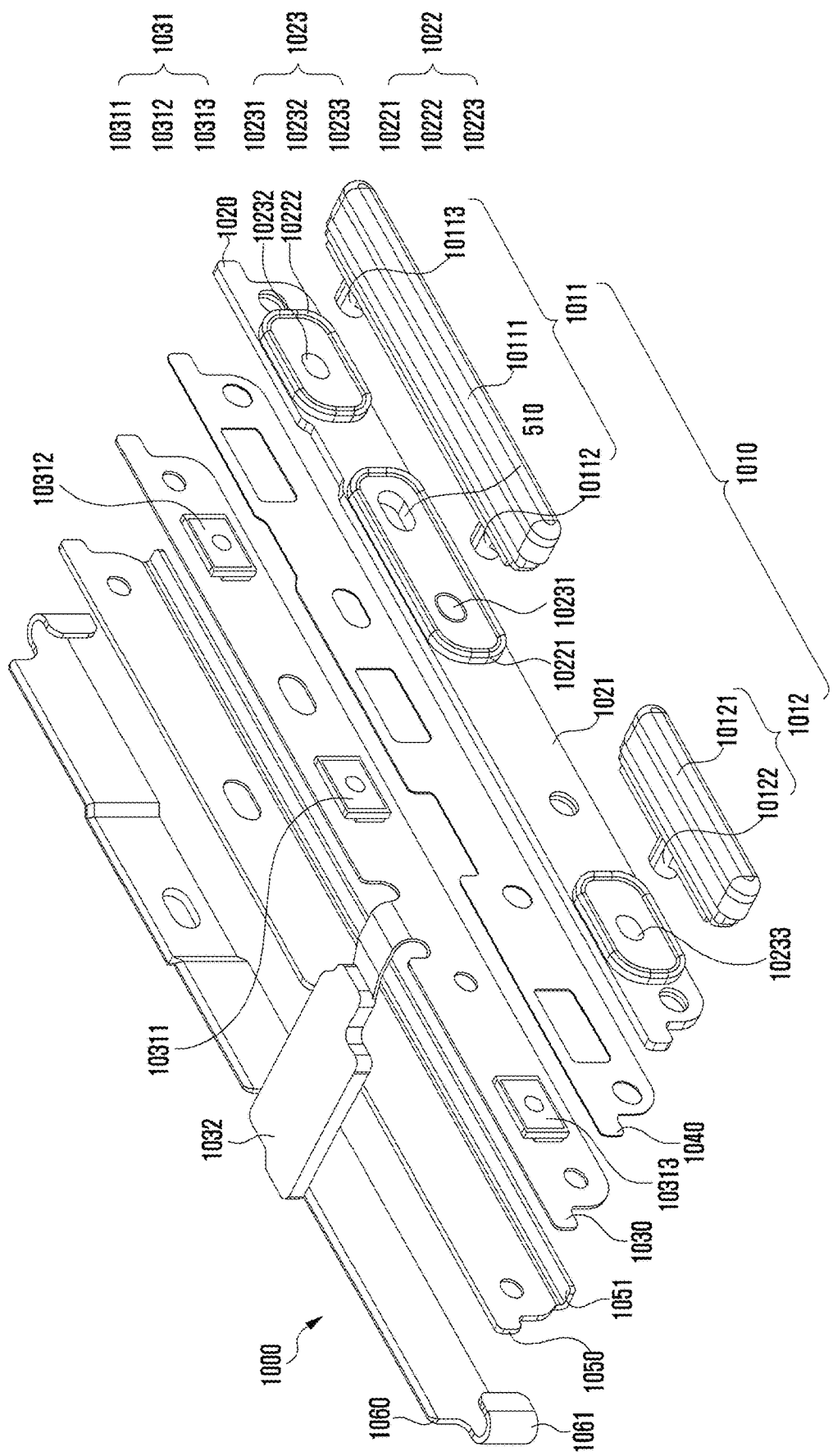

FIG. 11A
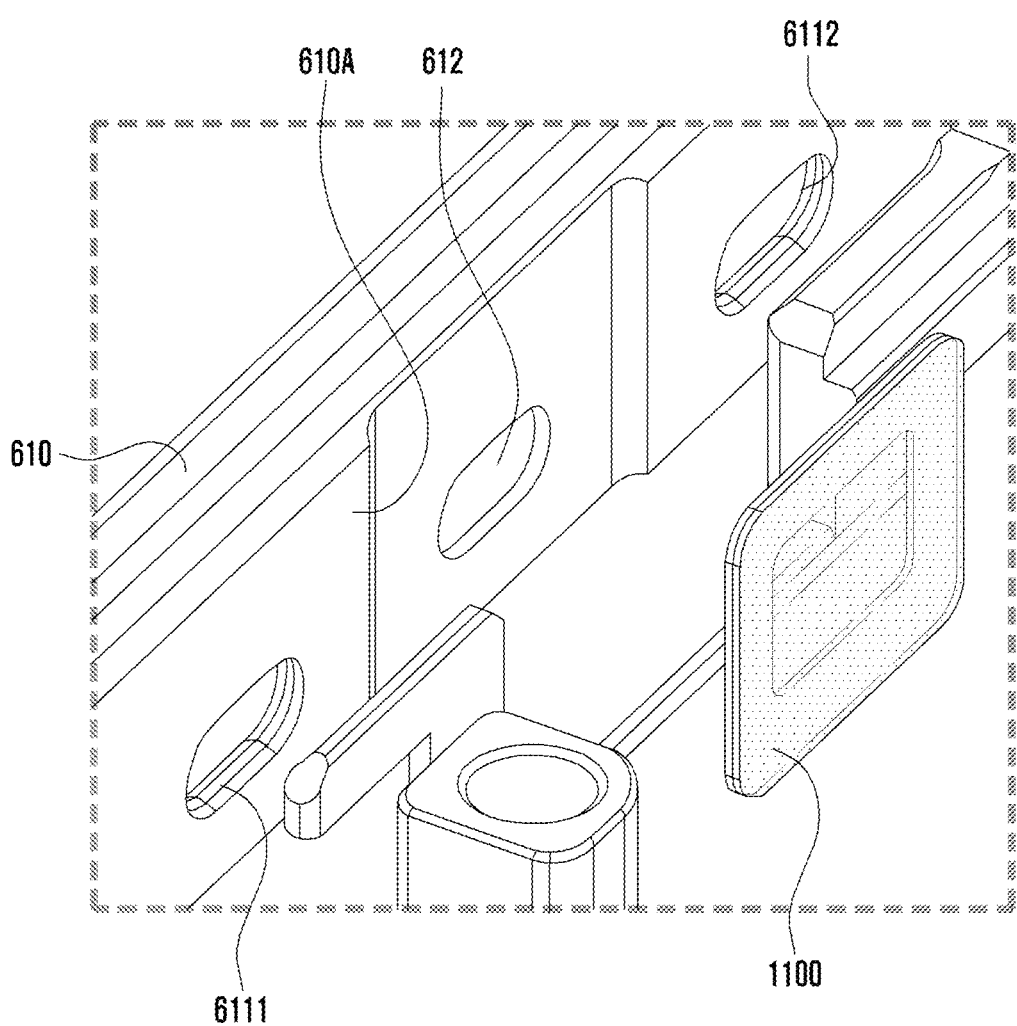
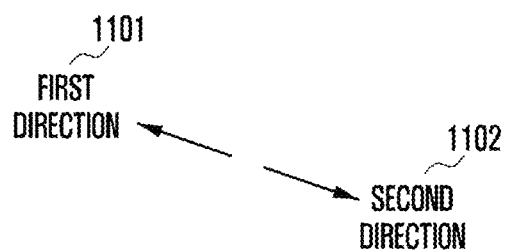

FIG. 11C
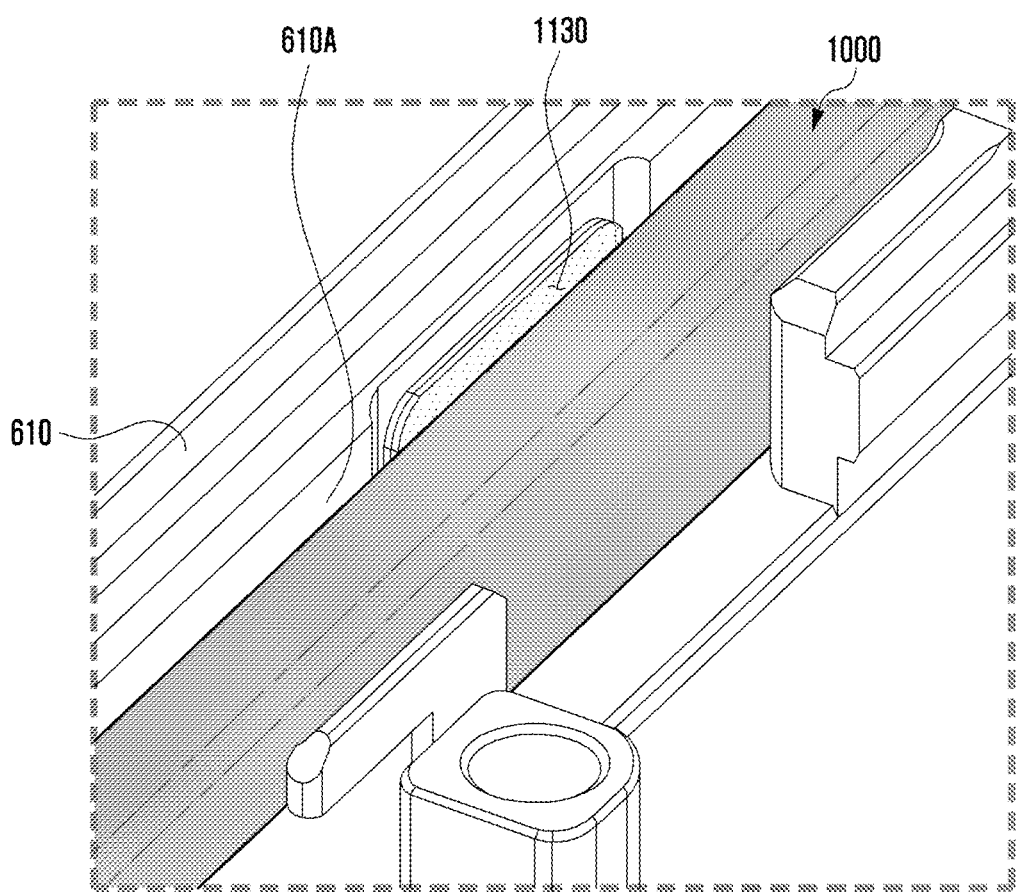
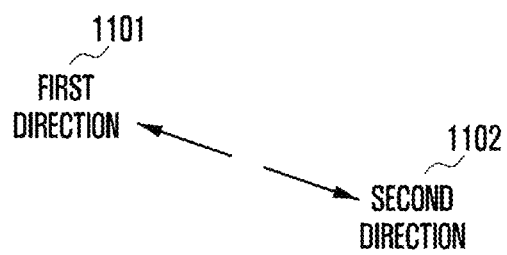

BUTTON DEVICE AND ELECTRONIC DEVICE COMPRISING SAME

CROSS-REFERENCE TO RELATED APPLICATION(S)

This application is a continuation application, claiming priority under § 365(c), of an International application No. PCT/KR2022/003833, filed on Mar. 18, 2022, which is based on and claims the benefit of a Korean patent application number filed on Mar. 24, 2021, in the Korean Intellectual Property Office, the disclosure of which is incorporated by reference herein in its entirety.

BACKGROUND

1. Field

The disclosure relates to a button device and an electronic device including the button device.

2. Description of Related Art

An electronic device may include an air vent configured to connect the inner space of the electronic device and the outer space of the electronic device. The air vent may form a structure inner air and outer air circulate therethrough.

The air vent may be used for various purposes, including a function of discharging heat from inside the electronic device to the outside, or maintaining the atmospheric pressure inside the electronic device at a constant level.

For example, some of electronic components included in the electronic device may generate heat by operations. For example, a processor including multiple processors may generate a large amount of heat by operations. Heat generated by electronic components may increase the temperature inside the electronic device.

In general, if an electronic device is exposed to a larger amount of heat, the same may be broken, or electric connection thereof may be damaged. Operations of electronic component may be controlled so as not to discharge an excessive amount of heat.

In order to manage temperature increase, it may be important to ensure that air is circulated efficiently inside and outside the electronic device. For example, a vent hole may be formed through the outer surface of the electronic device so as to be connected to the inner space.

The above information is presented as background information only to assist with an understanding of the disclosure. No determination has been made, and no assertion is made, as to whether any of the above might be applicable as prior art with regard to the disclosure.

SUMMARY

A vent hole formed on the outer surface of an electronic device for air circulation may degrade the aesthetic appearance of the exterior of the electronic device. The vent hole may act as a factor that degrades the integrity of design of the exterior of the electronic device.

Aspects of the disclosure are to address at least the above-mentioned problems and/or disadvantages and to provide at least the advantages described below. Accordingly, an aspect of the disclosure is to provide a button device and an electronic device including the button device, wherein a vent hole is provided in view of circulation of air inside and outside the electronic device and is configured not to be visible from outside the electronic device.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a key hole and a vent hole formed through the housing, a button member including a body part disposed in a first direction with respect to an outer wall of the housing so as to cover the key hole and the vent hole, and a button protrusion inserted into the key hole, a substrate member, disposed to face the outer wall of the housing in a second direction that is opposite to the first direction, which includes a switch configured to generate an electrical signal in case that the switch is actuated by the button protrusion of the button member, a waterproof member including a base disposed between the housing and the substrate member to cover the substrate member, and a sealing part, formed to protrude from the base in the second direction so as to surround a perimeter of at least one of the key hole and the vent hole, which has at least a part in close contact with the outer wall of the housing, a conduit configured to connect an inner space of the electronic device to outside of the electronic device through the vent hole, and a waterproof cover disposed on the conduit so as to block moisture from being introduced through the vent hole.

In accordance with another aspect of the disclosure, a button device is provided. The button device includes a button member including a body part and a button protrusion formed on the body part, a substrate member including a switch configured to generate an electrical signal in case that the switch is actuated by the button protrusion of the button member, and a second opening, and a waterproof member including a base disposed between the button member and the substrate member to cover the substrate member, a delivery part formed on the base to be disposed between the button protrusion of the button member and the switch of the substrate member, a first opening formed through the base to be spaced apart from the delivery part and be connected to the second opening of the substrate member, and a sealing part formed to protrude from the base in a direction of the button member so as to surround a perimeter of the first opening and the delivery part, an adhesive member, disposed between the waterproof member and the substrate member to bond the waterproof member to the substrate member, which comprises a third opening connected to the first opening and the second opening, and a substrate bracket which is configured to support the substrate member and comprises a fourth opening connected to the second opening.

According to various embodiments disclosed herein, the efficiency of air circulation through a vent hole may be increased such that the vent hole maintains an appropriate size, thereby reducing the processing cost and preventing waste of materials. The vent hole may be configured to induce air circulation such that performance limitation (for example, throttling) due to heating is reduced, thereby providing improved usability.

In addition, a dewing phenomenon or a joint phenomenon due to a difference in temperature between inside and outside the electronic device may be prevented.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 9A is a cross-sectional view taken along line A-A in FIG. 6 according to an embodiment of the disclosure;

FIG. 10 is an exploded perspective view of a button device according to an embodiment of the disclosure;

FIGS. 11A, 11B, and 11C are views showing a conduit of a button device according to various embodiments of the disclosure.

Throughout the drawings, it should be noted that like reference numbers are used to depict the same or similar elements, features, and structures.

DETAILED DESCRIPTION

Figure 1:
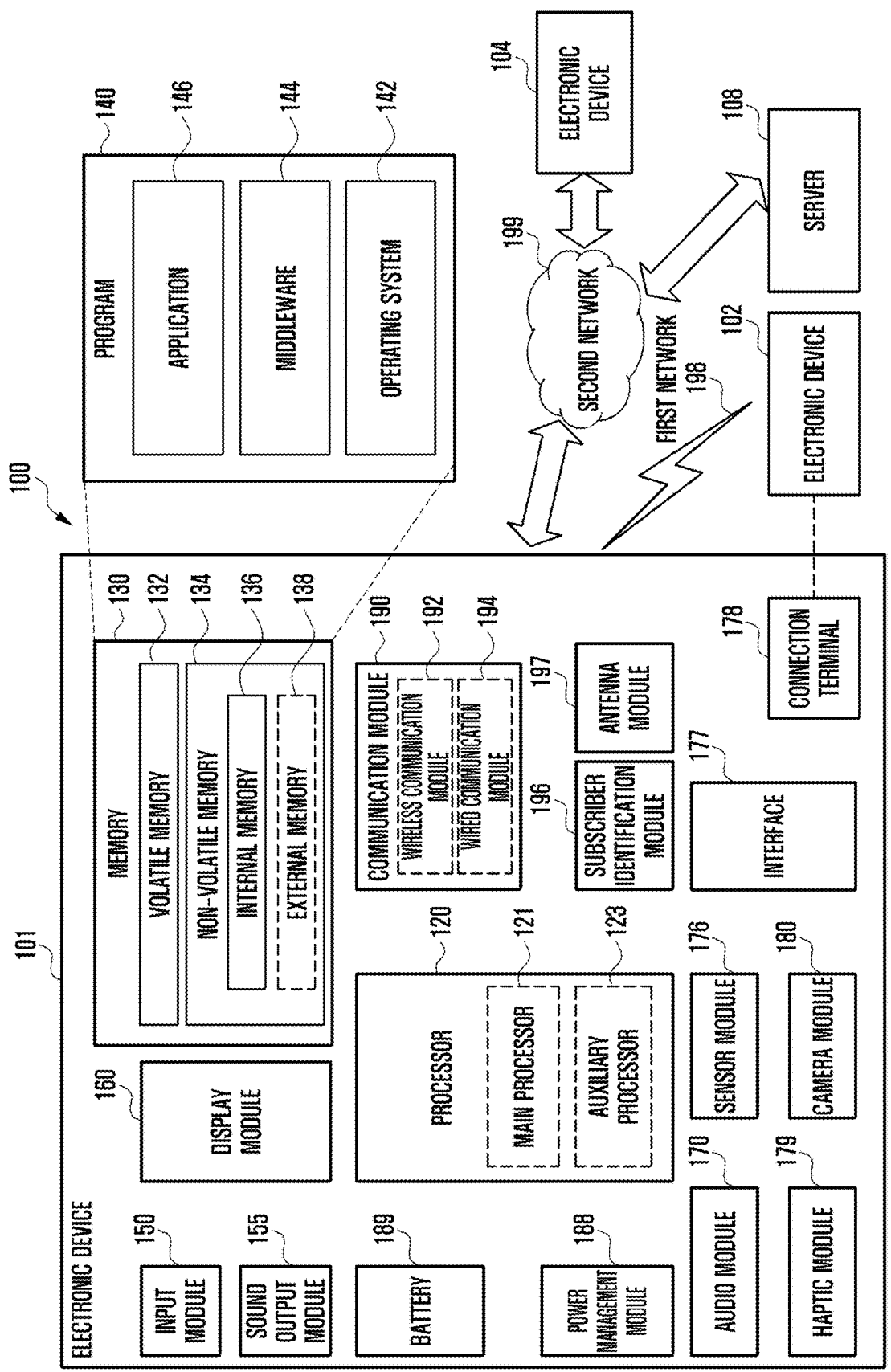
FIG. 1 is a block diagram of an electronic device in a network environment according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that various embodiments of the disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements.

As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include at least one of internal memory 136 or external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter (mm) Wave band) to achieve, e.g., a high data transmission rate. The wireless communication module 192 may support various technologies for securing performance on a high-frequency band, such as, e.g., beam-forming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 gigabits per second (Gbps) or more) for implementing eMBB, loss coverage (e.g., 164 decibels (dB) or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
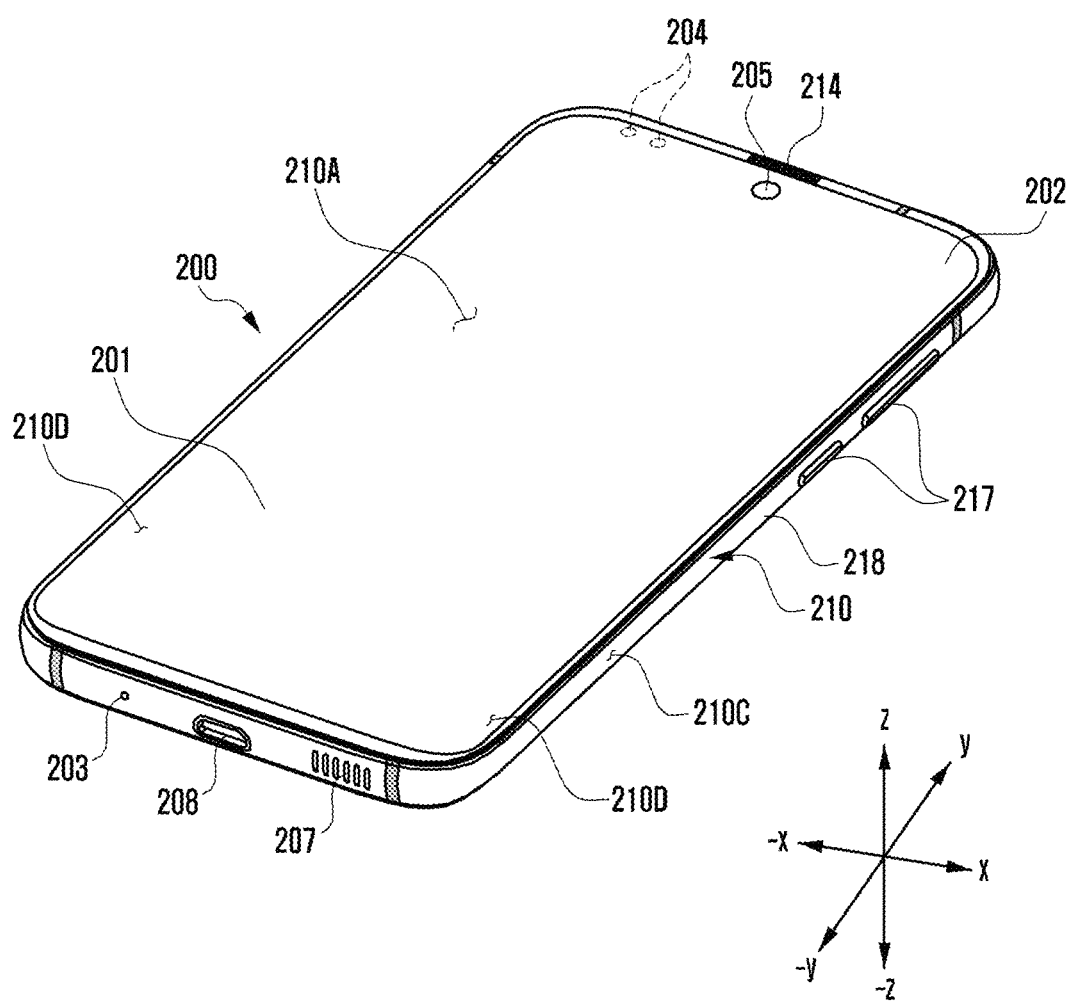
FIG. 2A is a front perspective view of an electronic device according to an embodiment of the disclosure.
Figure 2B:
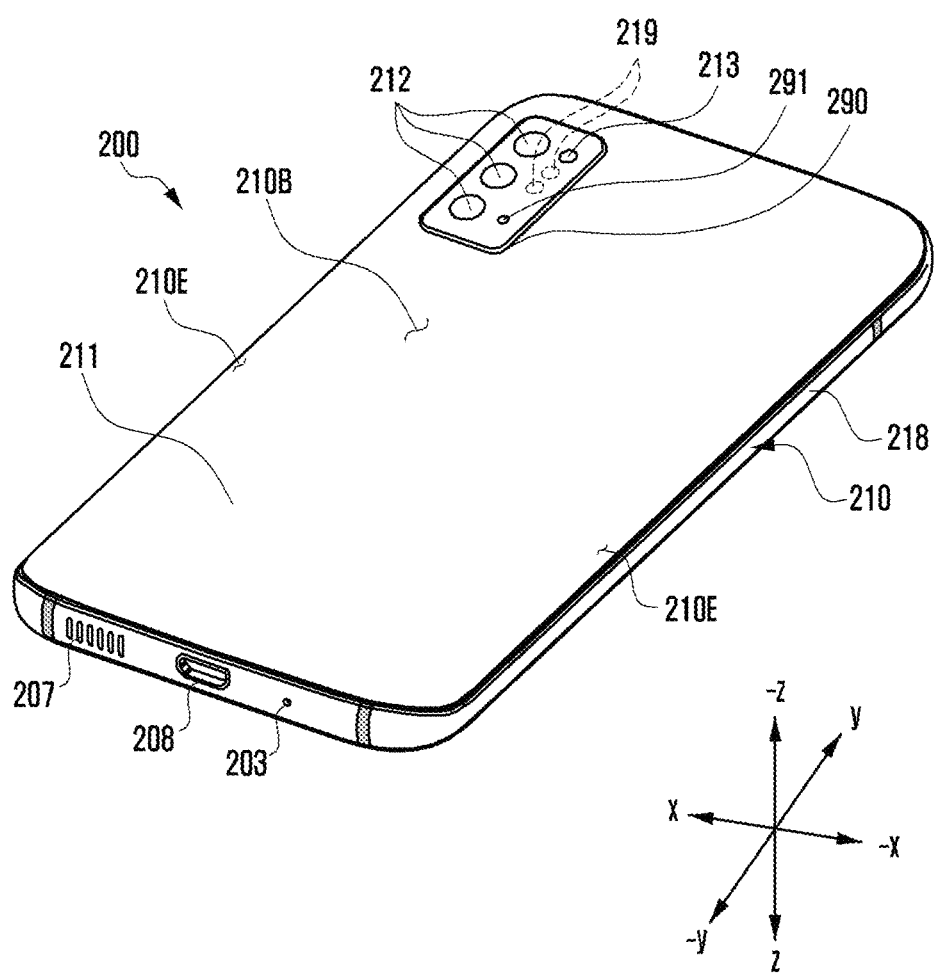
FIG. 2B is a rear perspective view of the electronic device in FIG. 2A according to an embodiment of the disclosure.

FIG. 2A is a front perspective view of an electronic device 200 (e.g., a mobile electronic device) according to an embodiment of the disclosure. FIG. 2B is a rear perspective view of the electronic device 200 in FIG. 2A according to an embodiment of the disclosure.

The electronic device 200 to be described hereinbelow may include at least one of the elements of the electronic device 101 previously described in FIG. 1.

Referring to FIGS. 2A and 2B, the mobile electronic device 200 may include a housing 210 that includes a first surface (or front surface) 210A, a second surface (or rear surface) 210B, and a lateral surface 210C that surrounds a space between the first surface 210A and the second surface 210B. The housing 210 may refer to a structure that forms a part of the first surface 210A, the second surface 210B, and the lateral surface 210C. The first surface 210A may be formed of a front plate 202 (e.g., a glass plate or polymer plate coated with a variety of coating layers) at least a part of which is substantially transparent. The second surface 210B may be formed of a rear plate 211 which is substantially opaque. The rear plate 211 may be formed of, for example, coated or colored glass, ceramic, polymer, metal (e.g., aluminum, stainless steel (STS), or magnesium), or any combination thereof. The lateral surface 210C may be formed of a lateral bezel structure (or "lateral member") 218 which is combined with the front plate 202 and the rear plate 211 and includes a metal and/or polymer. The rear plate 211 and the lateral bezel structure 218 may be integrally formed and may be of the same material (e.g., a metallic material such as aluminum).

The front plate 202 may include two first regions 210D disposed at long edges thereof, respectively, and bent and extended seamlessly from the first surface 210A toward the rear plate 211. Similarly, the rear plate 211 may include two second regions 210E disposed at long edges thereof, respectively, and bent and extended seamlessly from the second surface 210B toward the front plate 202. The front plate 202 (or the rear plate 211) may include only one of the first regions 210D (or of the second regions 210E). The first regions 210D or the second regions 210E may be omitted in part. When viewed from a lateral side of the mobile electronic device 200, the lateral bezel structure 218 may have a first thickness (or width) on a lateral side where the first region 210D or the second region 210E is not included, and may have a second thickness, being less than the first thickness, on another lateral side where the first region 210D or the second region 210E is included.

The mobile electronic device 200 may include at least one of a display 201, the input device 203, audio modules 207 and 214, sensor modules 204 and 219, camera modules 205 and 212, a key input device 217, indicator, and connector holes 208. The mobile electronic device 200 may omit at least one (e.g., the key input device 217 or the indicator) of the above components, or may further include other components.

The display 201 may be exposed through a substantial portion of the front plate 202, for example. At least a part of the display 201 may be exposed through the front plate 202 that forms the first surface 210A and the first region 210D of the lateral surface 210C. The display 201 may be combined with, or adjacent to, a touch sensing circuit, a pressure sensor capable of measuring the touch strength (pressure), and/or a digitizer for detecting a stylus pen. At least a part of the sensor modules 204 and 219 and/or at least a part of the key input device 217 may be disposed in the first region 210D and/or the second region 210E.

The input device 203 may include at least one microphone. In certain embodiments, the input device 203 may include a plurality of microphones disposed to detect the direction of a sound. The sound output devices 207 and 214 may include speakers 207 and 214. The speakers 207 and 214 may include an external speaker 207 and a receiver for calls 214. In certain embodiments, the microphone 203, the sound output devices 207 and 214 and the connector port 208 may be disposed at least partially in the internal space of the electronic device 200, and may be exposed to the external environment through at least one hole formed in the housing 210. In certain embodiments, the hole formed in the housing 210 may be commonly used for the microphone 203 and the speakers 207 and 214. In certain embodiments, the sound output devices 207 and 214 may include a speaker (e.g., piezo speaker) that operates without using a hole formed in the housing 210.

The sensor modules 204 and 219 may generate electrical signals or data corresponding to an internal operating state of the mobile electronic device 200 or to an external environmental condition. The sensor modules 204 and 219 may include a first sensor module 204 (e.g., a proximity sensor) and/or a second sensor module (e.g., a fingerprint sensor) disposed on the first surface 210A of the housing 210, and/or a third sensor module 219 (e.g., a heart rate monitor (HRM) sensor) and/or a fourth sensor module (e.g., a fingerprint sensor) disposed on the second surface 210B of the housing 210. The fingerprint sensor may be disposed on the second surface 210B as well as the first surface 210A (e.g., the display 201) of the housing 210. The electronic device 200 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205 and 212 may include a first camera device 205 disposed on the first surface 210A of the electronic device 200, and a second camera device 212 and/or a flash 213 disposed on the second surface 210B. The camera module 205 or the camera module 212 may include one or more lenses, an image sensor, and/or an image signal processor. The flash 213 may include, for example, a light emitting diode or a xenon lamp. Two or more lenses (infrared cameras, wide angle and telephoto lenses) and image sensors may be disposed on one side of the electronic device 200.

The second camera module 212 may be protected by a camera housing 290 disposed on the second surface 210B of the electronic device 200. At least a part of the camera housing 290 may be exposed to the second surface 210B of the electronic device 200. An external hole 291 may be formed through the camera housing 290. In an embodiment, an external sound introduced through the external hole 291 may be delivered to a microphone module (not shown) disposed adjacent to the second camera module 212.

The key input device 217 may be disposed on the lateral surface 210C of the housing 210. The mobile electronic device 200 may not include some or all of the key input device 217 described above, and the key input device 217 which is not included may be implemented in another form such as a soft key on the display 201. In another embodiment, the key input device 217 may be implemented using a pressure sensor included in the display 201.

The indicator may be disposed on the first surface 210A of the housing 210. For example, the indicator may provide status information of the electronic device 200 in an optical form. In another embodiment, the indicator may provide a light source associated with the operation of the camera module 205. The light indicator may include, for example, a light emitting diode (LED), an IR LED, or a xenon lamp.

The connector holes 208 may include a first connector hole 208 adapted for a connector (e.g., a USB connector) for transmitting and receiving power and/or data to and from an external electronic device, and/or a second connector hole adapted for a connector (e.g., an earphone jack) for transmitting and receiving an audio signal to and from an external electronic device.

Some camera modules 205 of camera modules 205 and 212, some sensor modules 204 of sensor modules 204 and 219, or an indicator may be arranged to be exposed through a display 201. For example, the camera module 205, the sensor module 204, or the indicator may be arranged in the internal space of an electronic device 200 so as to be brought into contact with an external environment through an opening of the display 201, which is perforated up to a front plate 202. According to an embodiment, an area corresponding to some camera module 205 of the display 201 is a part of an area in which content is displayed, and may be formed as a transmission area having designated transmittance. For example, the transmission area may be formed to have transmittance having a range of about 5% to about 20%. The transmission area may include an area overlapped with a valid area (e.g., a field of view (FOV)) of the camera module 205 through which light imaged by an image sensor and for generating an image passes. For example, a transmission area of the display 201 may include an area in which the density of pixels and/or a wiring density are lower than that of surroundings. The camera module 205 may include, for example, under display camera (UDC). In another embodiment, some sensor modules 204 may be arranged to perform their functions without being visually exposed through the front plate 202 in the internal space of the electronic device. For example, in this case, an area of the display 201 facing the sensor module may not require a perforated opening.

According to various embodiments, the electronic device 200 may have a bar-type appearance or a plate-type appearance, but the disclosure is not limited thereto. For example, the illustrated electronic device 200 may be a part of a foldable electronic device, a slidable electronic device, a stretchable electronic device, and/or a rollable electronic device. A "foldable electronic device", a "slidable electronic device", a "stretchable electronic device", and/or a "rollable electronic device" may mean an electronic device in which a display (e.g., the display 330 in FIG. 3) may be bent and deformed so that at least a portion thereof is folded, or wound or rolled, or an area of a display is at least partially expanded and/or is accommodated inside a housing (e.g., the housing 210 in FIGS. 2A and 2B). A foldable electronic device, a slidable electronic device, a stretchable electronic device, and/or a rollable electronic device may be configured such that a display is unfolded or a larger area of a display is exposed to the outside so as to expand and use a screen display area thereof, according to user needs.

Figure 3:
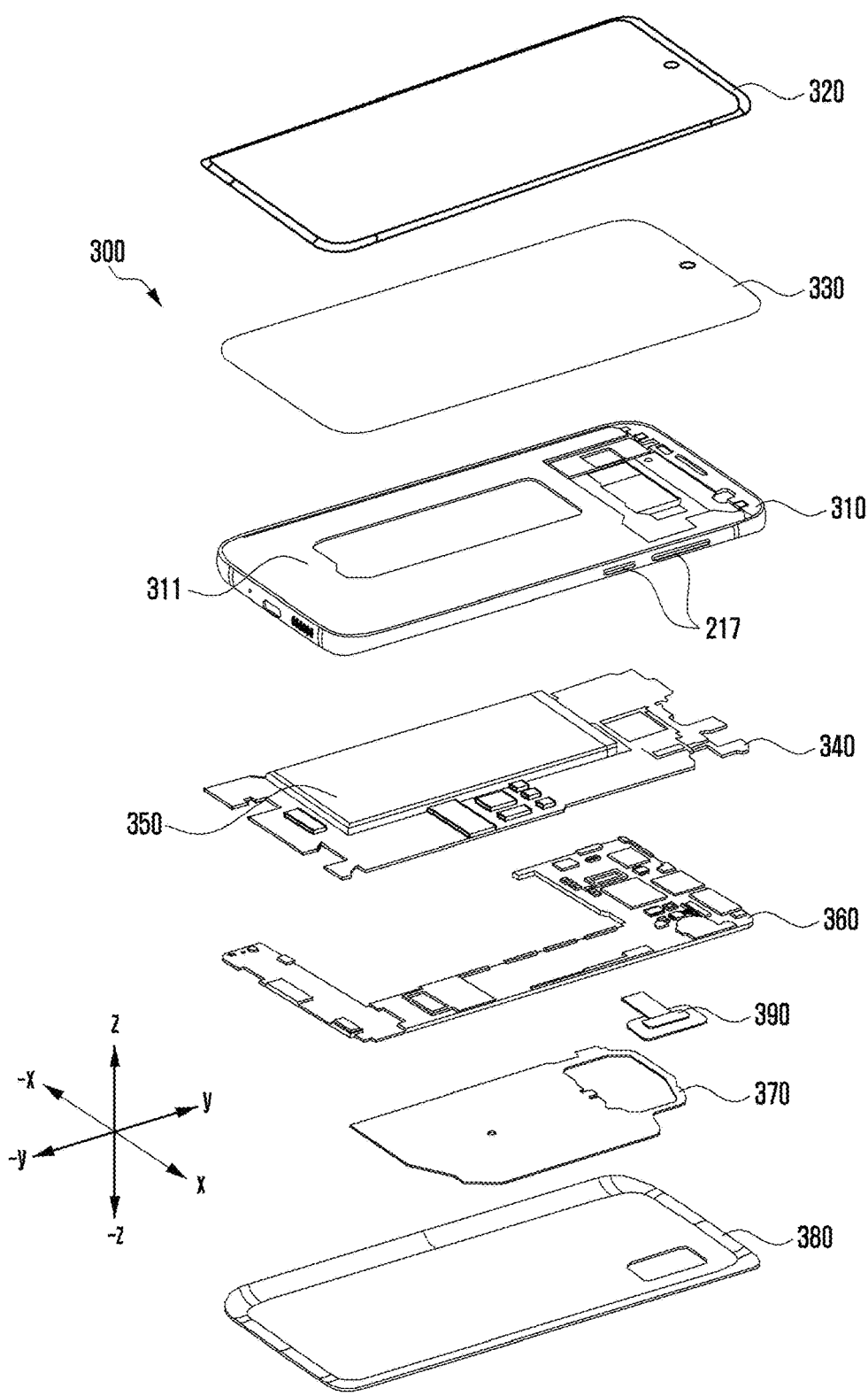
FIG. 3 is an exploded perspective view of the electronic device 200 in FIG. 2A according to an embodiment of the disclosure.

FIG. 3 is an exploded perspective view of the electronic device 200 in FIG. 2A according to an embodiment of the disclosure.

An electronic device 300 in FIG. 3 may be at least partially similar to the electronic device 200 in FIGS. 2A and 2B, or may include another embodiment of the electronic device.

Referring to FIG. 3, the electronic device 300 (e.g., the electronic device 200 in FIG. 2A or 2B) may include a lateral member 310 (e.g., a lateral bezel structure), a first support member 311 (e.g., a bracket or a support structure), a front plate 320 (e.g., a front cover), a display 330 (e.g., the display 201 in FIG. 2A), a substrate 340 (e.g., a printed circuit board (PCB), a flexible PCB (FPCB), or a rigid-flexible PCB (RFPCB)), a battery 350, a second support member 360 (e.g., a rear case), an antenna 370, and a rear plate 380 (e.g., a rear cover). In some embodiments, at least one (e.g., the first support member 311 or the second support member 360) of the elements may be omitted from the electronic device 300, or other elements may be additionally included therein. At least one of elements of the electronic device 300 may be the same as or similar to at least one of elements of the electronic device 200 in FIG. 2A or 2B, and overlapping descriptions thereof will be omitted hereinafter.

The first support member 311 may be disposed inside the electronic device 300, and may be connected to the lateral member 310 or integrally formed with the lateral member 310. For example, the first support member 311 may be formed of a metal material and/or a non-metal (e.g., polymer) material. The first support member 311 may have one surface to which the display 330 is coupled, and the other surface to which the substrate 340 is coupled. A processor, a memory, and/or an interface may be mounted to the substrate 340. For example, the processor may include one or more of a central processing device, an application processor, a graphic processing device, an image signal processor, a sensor hub processor, and a communication processor.

For example, the memory may include a volatile memory or a non-volatile memory.

For example, the interface may include a high definition multimedia interface (HDMI), a universal serial bus (USB) interface, an SD card interface, and/or an audio interface. For example, the interface may electrically or physically connect the electronic device 300 to an external electronic device, and may include a USB connector, an SD card/multimedia card (MMC) connector, or an audio connector.

The battery 350 may be a device for supplying power to at least one element of the electronic device 300, and for example, may include a non-rechargeable primary cell, a rechargeable secondary cell, or a fuel cell. For example, at least a part of the battery 350 may be disposed on substantially the same plane as the substrate 340. The battery 350 may be integrally disposed inside the electronic device 300. As another embodiment, the battery 350 may also be disposed detachably from the electronic device 300.

The antenna 370 may be disposed between the rear plate 380 and the battery 350. For example, the antenna 370 may also include a near field communication (NFC) antenna, a wireless charging antenna, and/or a magnetic secure transmission (MST) antenna. For example, the antenna 370 may be configured to perform a short-range communication with an external device, or may wirelessly transmit/receive a power required for charging. In another embodiment, an antenna structure may be formed by a part of the lateral bezel structure 310 and/or the first support member 311, or a combination thereof.

According to various embodiments, the electronic device 300 may include a camera module 390 (e.g., the camera module 180 in FIG. 1). The camera module 390 illustrated in FIG. 3 may include at least one camera for photographing in the rear direction (e.g., the −Z-axis direction in FIG. 3) of the electronic device 300. In addition, the electronic device 300 may include various camera modules. For example, a camera module including at least one camera for photographing in the front direction (e.g., the +Z-axis direction in FIG. 3) of the electronic device may be further included.

Figure 4:
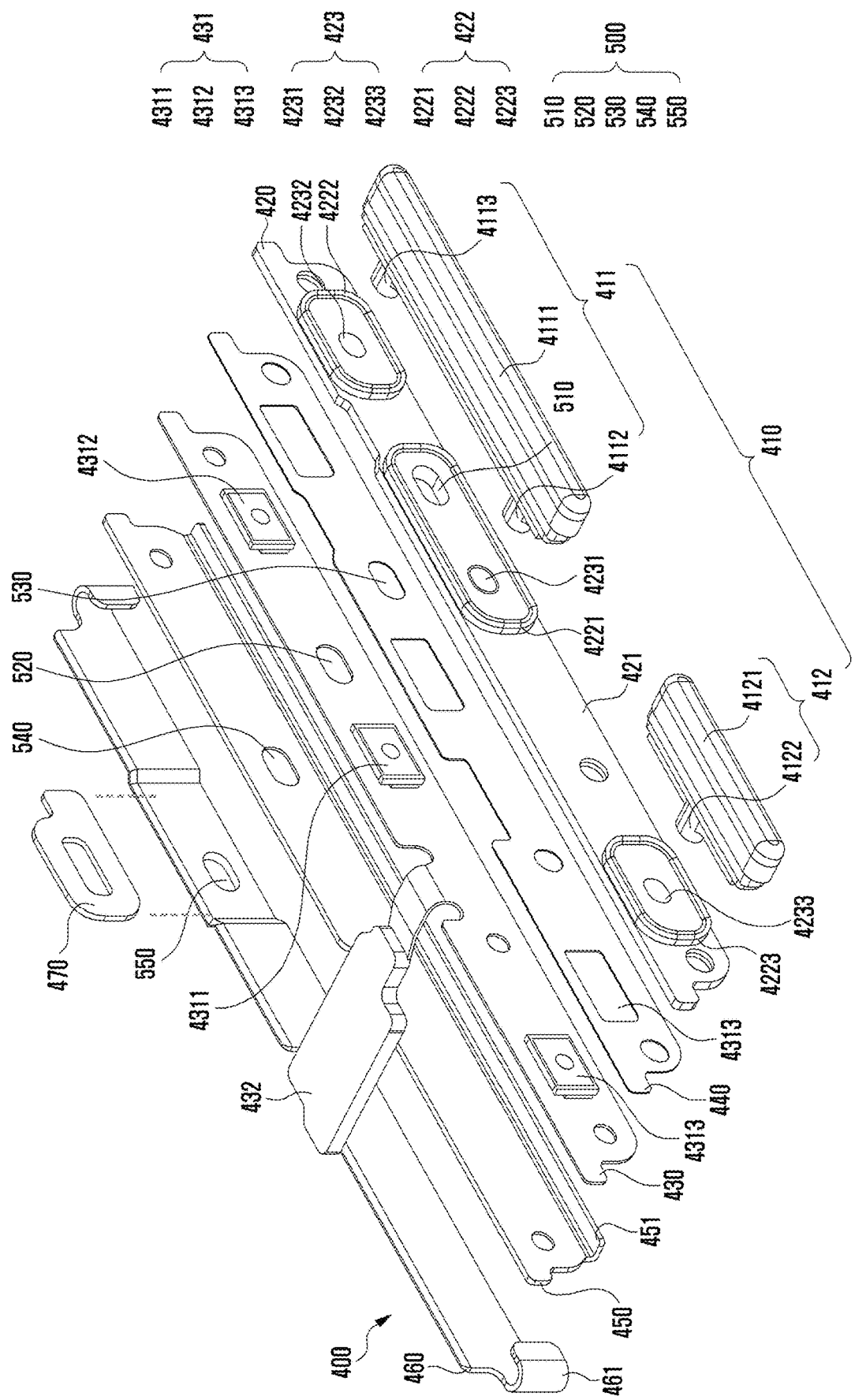
FIG. 4 is an exploded perspective view of a button device according to an embodiment of the disclosure.
Figure 5:
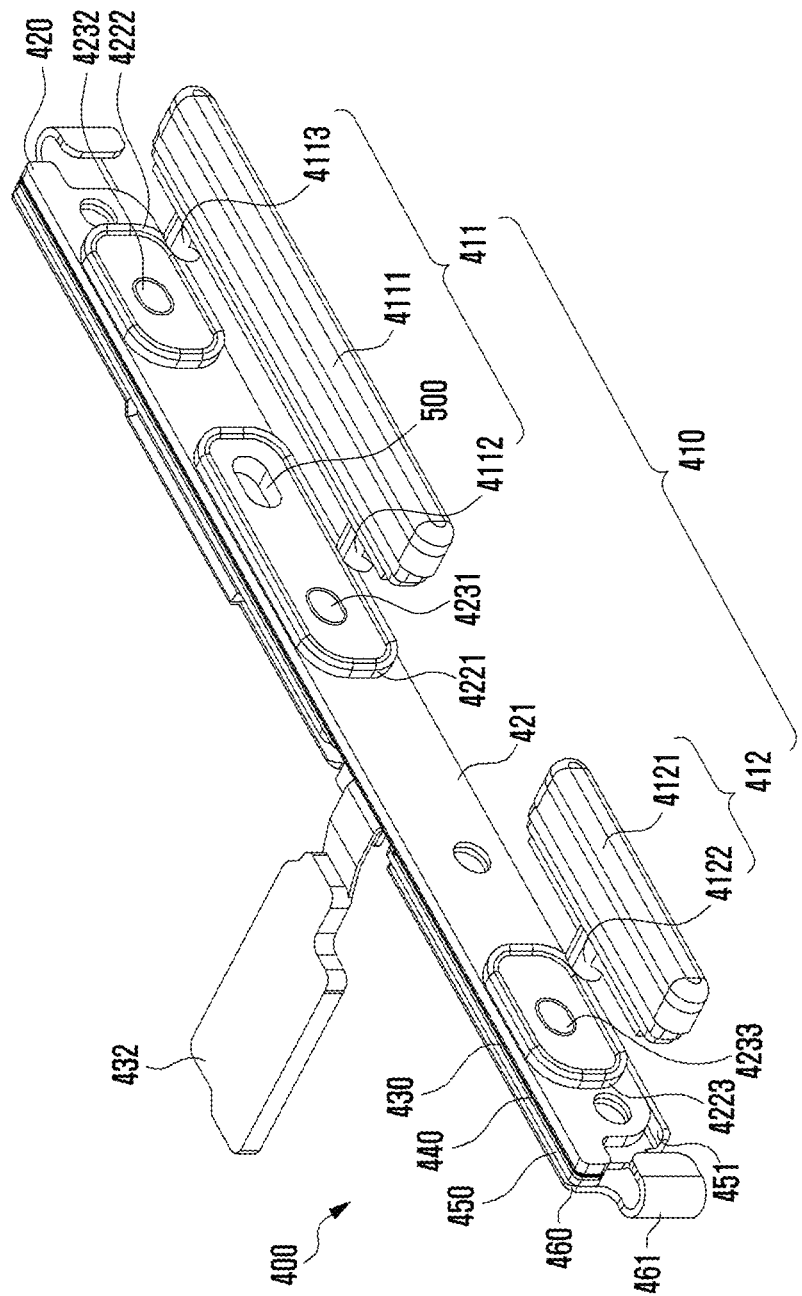
FIG. 5 is a perspective view of the button device illustrated in FIG. 4 according to an embodiment of the disclosure.

FIG. 4 is an exploded perspective view of a button device according to an embodiment of the disclosure. FIG. 5 is a perspective view of the button device illustrated in FIG. 4 according to an embodiment of the disclosure.

A button device 400 (e.g., the key input device 217 in FIG. 2A) according to various embodiments disclosed in the document may mean an input device which functions by being pressed by an external force. An electrical signal may be generated in case that a switch included in the button device 400 is pressed by an external force applied by a user, and various functions of an electronic device (e.g., the electronic device 101 in FIG. 1 and the electronic device 200 in FIG. 2A) may be performed according to the generated electrical signal. For example, various functions, such as volume up, volume down, sleep mode entry, the performing of a camera function, power off or power on, the execution of a voice command function (e.g., Bixby), may be performed as the button device 400 is pressed. The various functions may be set at the time of manufacturing an electronic device, and may be arbitrarily selected by a user according to a user interface.

The button device 400 may be disposed at various positions in an electronic device. Hereinafter, in describing positions of an electronic device, a portion, at which a display module (e.g., the display 330 in FIG. 3) of an electronic device is disposed, may be referred to as a front surface (e.g., the first surface 210A in FIG. 2A), a surface opposite to the front surface may be referred to as a rear surface (e.g., the second surface 210B in FIG. 2B), and portions other than the front surface and the rear surface may be referred to as side surfaces (e.g., the side surfaces 210C in FIG. 2A). For example, the button device 400 may be disposed on the front surface, the rear surface, and/or the side surfaces of an electronic device. Hereinafter, the button device 400 will be described as a side key positioned on the side surfaces of an electronic device. However, the position of the button device 400 to be described in the following descriptions and drawings does not limit the position of the button device 400 according to various embodiments of the disclosure.

Referring to FIGS. 4 and 5, the button device 400 may include a button member 410, a waterproof member 420, an adhesive member 440, a substrate member 430, a substrate bracket 450, a button bracket 460. Hereinafter, the button device 400 including all of the elements described above will be described as an example, but the button device 400 according to various embodiments disclosed in the document is not limited to and interpreted as only those that include all of the elements described above. The elements of the button device 400 described above may be merely an example, and some of the elements described above may be omitted within the range in which a person skilled in the art can understand. In addition, it may be also possible to configure the button device 400 by adding other elements in addition to the described elements. For example, the substrate bracket 450 and the button bracket 460 may be configured as one integrated bracket, and at least one of the substrate bracket 450, the button bracket 460, and/or the adhesive member 440 may be omitted. In addition, various modifications may be possible.

Referring to FIG. 4, the button device 400 may include a stacked structure of the button member 410—the waterproof member 420—the adhesive member 440—the substrate member 430—the substrate bracket 450—the button bracket 460. The stacked structure may be merely an example, and the stacking order thereof may be changed.

According to various embodiments, the button member 410 may transmit an external force applied by a user to a switch 431 of the substrate member 430. In an embodiment, as illustrated in FIGS. 4 and 5, two button members 410 may be provided. In addition, the number of the button members 410 may be variously changed. Different functions may be performed according to an external force applied to the button member 410. For example, according to an external force applied to a first button member 411, a switch (e.g., the first switch 4311 or the second switch 4312) corresponding to a first button member 411 may be pressed, and thus the volume thereof may be increased or decreased. According to an external force applied to a second button member 412, a switch (e.g., the third switch 4313) corresponding to the second button member 412 may be pressed, and thus the electronic device may enter a sleep mode or the sleep mode may be released.

A first body part 4111 of the first button member 411 may mean a portion forming the overall shape of the first button member 411. A part of the first body part 4111 may be exposed to the outer surface of the electronic device. A user may apply an external force to the first body part 4111 exposed to the outer surface of the electronic device. The first body part 4111 exposed to the outer surface of the electronic device may include a color and a shape distinguished from other portions of the electronic device so that the first button member 411 is distinguished from other portions (e.g., a housing (e.g., the housing 610 in FIG. 6)) of an electronic device. In addition, the surface of the first body part 4111, which is exposed to the outer surface of the electronic device, may include a non-slip structure so that a user's body for applying an external force to the first body part 4111 is not slipped on the surface of the first body part 4111. For example, a rough surface may be formed on the surface of the first body part 4111 in order to increase the surface roughness thereof.

The first button member 411 may include a first button protrusion 4112 and a second button protrusion 4113. The button protrusions 4112 and 4113 may be formed to protrude from a portion of the first body part 4111. The button protrusions 4112 and 4113 may press switches 4311 and 4312 of the substrate member 430 to be described later. In case that a user applies an external force to the first body part 4111, the first button protrusion 4112 or the second button protrusion 4113 formed on the first body part 4111 may press the switches 4311 and 4312 of the substrate member 430. The switches 4311 and 4312 pressed by the first button protrusion 4112 or the second button protrusion 4113 may generate electrical signals so that a preset function is performed. The number of the button protrusions may be variously changed. Although the first button member 411 has been described as including the first button protrusion 4112 and the second button protrusion 4113 in FIG. 4, the first button member 411 may include only one button protrusion.

The second button member 412 may include a second body part 4121 and a third button protrusion 4122 formed on the second body part 4121. The second body part 4121 and third button protrusion 4122 of the second button member 412 may be similar to the first body part 4111 and the first button protrusion 4112 (or the second button protrusion 4113) of the first button member 411, and thus the detailed descriptions thereof will be omitted.

According to various embodiments, the waterproof member 420 may include a base 421, a delivery part 423, a first opening 510, and a sealing part 422. The waterproof member 420 may be an element for blocking foreign substances and moisture so that foreign substances and moisture introduced from the outside of the electronic device do not move into the substrate member 430 or inside the electronic device.

The base 421 may be formed to entirely cover the substrate member 430. The base 421 may be formed of various materials. For example, the base 421 may be formed of a synthetic resin material having an elastic force, a silicone-based material, or a rubber-based material. The base 421 may come into contact with various foreign substances and moisture introduced from the outside the electronic device, and thus may be formed of a material which is not damaged by repeated contact with the foreign substances.

The delivery part 423 may be formed on a portion of the base 421. In another embodiment, the delivery part 423 may be formed of a material different from that of the base 421, and be coupled to the base 421. The delivery part 423 may be formed at a position facing the switch 431 of the substrate member 430. In addition, the button protrusions 4112, 4113, and 4122 of the button member 410 may be in contact with the delivery part 423. The delivery part 423 may be disposed between the button protrusions 4112, 4113, and 4122 and the switch 431. The delivery part 423 may be formed of a deformable material. In an embodiment, the delivery part 423 may be formed of a harder material than the base 421. For example, the delivery part 423 may be formed of a material such as metal, polymer, or rubber. In case that the button protrusion 4112, 4113, or 4122 presses the delivery part 423, the delivery part 423 may be deformed or moved so that the switch 431 is pressed. The number of delivery parts 423 may correspond to the number of the button protrusions 4112, 4113, and 4122. For example, in the case of FIG. 4, a first delivery part 4231 may be in contact with the first button protrusion 4112, a second delivery part 4232 may be in contact with the second button protrusion 4113, and a third delivery part 4233 may be in contact with the third button protrusion 4122.

The first opening 510 may be a hole formed through the base 421. The first opening 510 may be formed through the base 421 at a position spaced a predetermined distance apart from the first delivery part 4231. The first opening 510 may be connected to a second opening 520 formed through the substrate member 430 to be described later. In an embodiment, the outside of an electronic device and the first opening 510 may be connected. For example, the internal air of an electronic device may be discharged to the outside of the electronic device through the first opening 510, and external air may be introduced into the electronic device through the first opening 510.

The sealing part 422 may be formed to protrude from the base 421 in the direction of the button member 410. The sealing part 422 may include a first sealing part 4221, a second sealing part 4222, and a third sealing part 4223. The sealing part 422 may be formed to surround at least one of the delivery part 423 and the first opening 510. In an embodiment, the first sealing part 4221 may be formed to protrude and thus surround both the delivery part 423 and the first opening 510. Referring to FIG. 4, the first sealing part 4221 may be formed to protrude in the direction of the first button member 411 at the perimeter of the first delivery part 4231 and the first opening 510, and thus may surround the first delivery part 4231 and the first opening 510. The second sealing part 4222 may be formed to protrude in the direction of the first button member 411 at the perimeter of the second delivery part 4232, and thus may surround the second delivery part 4232. The third sealing part 4223 may be formed to protrude in the direction of the second button member 412 at the perimeter of the third delivery part 4233, and thus may surround the third delivery part 4233.

By the first sealing part 4221, foreign substances or moisture introduced into the portion, in which the first delivery part 4231 and first opening 510 exist, may not be moved to other portions (e.g., a portion in which the second delivery part 4232 and/or the third delivery part 4233 are positioned). By the second sealing part 4222, foreign substances or moisture introduced into the portion, in which the second delivery part 4232 exists, may not be moved to other portions (e.g., a portion in which the first delivery part 4231 and/or the third delivery part 4233 are positioned). By the third sealing part 4223, foreign substances or moisture introduced into the portion, in which the third delivery part 4233 exists, may not be moved to other portions (e.g., a portion in which the first delivery part 4231 and/or the second delivery part 4232 are positioned). In an embodiment, the sealing part 422 may be formed of a flexible material.

According to various embodiments, the substrate member 430 may include the switch 431. Referring to FIG. 4, three switches 431 may also be provided to correspond to three button protrusions (the first button protrusion 4112, the second button protrusion 4113, and the third button protrusion 4122). A first switch 4311 may be pressed by the first button protrusion 4112, a second switch 4312 may be pressed by the second button protrusion 4113, and a third switch 4313 may be pressed by the third button protrusion 4122. For example, the substrate member 430 may be a printed circuit board or a flexible printed circuit board. The substrate member 430 may include a connection member 432 to be connected to a main substrate (e.g., the substrate 340 in FIG. 3) of an electronic device. For example, the connection member 432 may be a flexible printed circuit board. The connection member 432 may have one end connected to the substrate member 430, and the other end connected to a main substrate of an electronic device. An electrical signal generated by the switch 431 may be delivered to a main substrate of an electronic device through the connection member 432.

In an embodiment, the second opening 520 connected to the first opening 510 of the waterproof member 420 may be formed through the substrate member 430. The second opening 520 may be a hole formed through the substrate member 430.

In an embodiment, the switch 431 may generate an electrical signal by being pressed. For example, the switch 431 may be configured such that terminals thereof are in contact with each other by pressing. In addition, the capacitance or the magnetic field of the switch 431 may be changed by pressing. In an embodiment, the switch 431 may include a structure which can be pressed by pressing and restored again. For example, the switch 431 may include a rubber dome structure and a spring structure.

According to various embodiments, the adhesive member 440 may be disposed between the waterproof member 420 and the substrate member 430. The adhesive member 440 may be formed of an adhesive material so that the waterproof member 420 and the substrate member 430 are bonded to each other. In an embodiment, the adhesive member 440 may bond the waterproof member 420 and the substrate member 430 to each other so that a space between the waterproof member 420 and the substrate member 430 is airtight.

In an embodiment, a third opening 530 may be formed through the adhesive member 440. The third opening 530 may be connected to the first opening 510 and the second opening 520. The third opening 530 may be a hole formed through the adhesive member 440.

According to various embodiments, the substrate bracket 450 may support the substrate member 430. For example, the substrate bracket 450 may be formed of a material having higher rigidity than the substrate member 430. In an embodiment, by a clip 451 formed on a part of the outer circumferential surface of the substrate bracket 450, the substrate member 430 may be coupled to substrate bracket 450.

In an embodiment, a fourth opening 540 may be formed through the substrate bracket 450. The fourth opening 540 may be a hole formed through the substrate bracket 450 to be connected to the second opening 520 formed through the substrate member 430.

According to various embodiments, the button bracket 460 may entirely support the button device 400. For example, the button bracket 460 may support the waterproof member 420, the adhesive member 440, the substrate member 430, and the substrate bracket 450. In an embodiment, by a clip 461 formed on a part of the outer circumferential surface of the button bracket 460, the button device 400 may be installed in an electronic device. The clip 461 illustrated in FIG. 4 may be merely one of various methods of installing the button device 400 in an electronic device. For example, the button device 400 may be installed in an electronic device through various fixation structures such as a screw, a pin, and a rivet. In an embodiment, by a fixation part (not shown) formed on the button bracket 460, the waterproof member 420, the adhesive member 440, the substrate member 430, and the substrate bracket 450 may be coupled to the button bracket 460. As the button bracket 460 is installed in a housing of an electronic device, the button device 400 may be installed in the electronic device.

In an embodiment, a fifth opening 550 may be formed through the button bracket 460. The fifth opening 550 may be a hole formed through the button bracket 460 to be connected to the fourth opening 540 formed through the substrate bracket 450.

The button device 400 disclosed in the document may be configured such that the first opening 510 formed through the waterproof member 420, the third opening 530 formed through the adhesive member 440, the second opening 520 formed through the substrate member 430, the fourth opening 540 formed through the substrate bracket 450, and the fifth opening 550 formed through the button bracket 460 are connected to one another.

According to various embodiments, a conduit 500 may be an air movement passage which allows the air outside the electronic device and the air in the inner space of an electronic device to circulate each other. The conduit 500 may include the first opening 510, the second opening 520, the third opening 530, the fourth opening 540, and the fifth opening 550.

External air may be introduced into the electronic device via the first opening 510—the third opening 530—the second opening 520—the fourth opening 540—the fifth opening 550. Internal air of the electronic device may be discharged outside the electronic device via the fifth opening 550—the fourth opening 540—the second opening 520—the third opening 530—the first opening 510. External air and internal air may be circulated through the openings formed through the button device 400.

According to various embodiments, a waterproof cover 470 may be disposed at a position capable of closing any one of the first opening 510 to the fifth opening 550. The waterproof cover 470 may be formed of a material which allows air to pass therethrough but does not allow foreign substances or moisture to pass therethrough. For example, the waterproof cover 470 may be made of a Gore-Tex material. The waterproof cover 470 may include a mesh structure. Referring to FIG. 4, the waterproof cover 470 may be disposed between the fourth opening 540 and the fifth opening 550. Moisture introduced from the outside of the electronic device may be blocked by the waterproof cover 470, and thus moisture may not be introduced into the electronic device.

Figure 6:
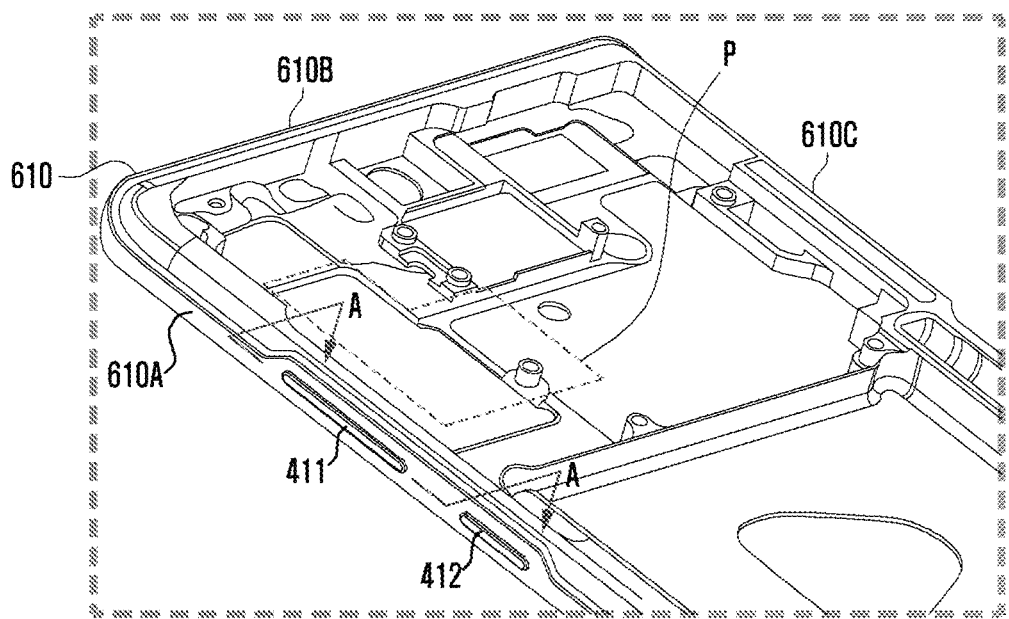
FIG. 6 is a view showing a state in which a button device is installed in a housing of an electronic device according to an embodiment of the disclosure.
Figure 7:
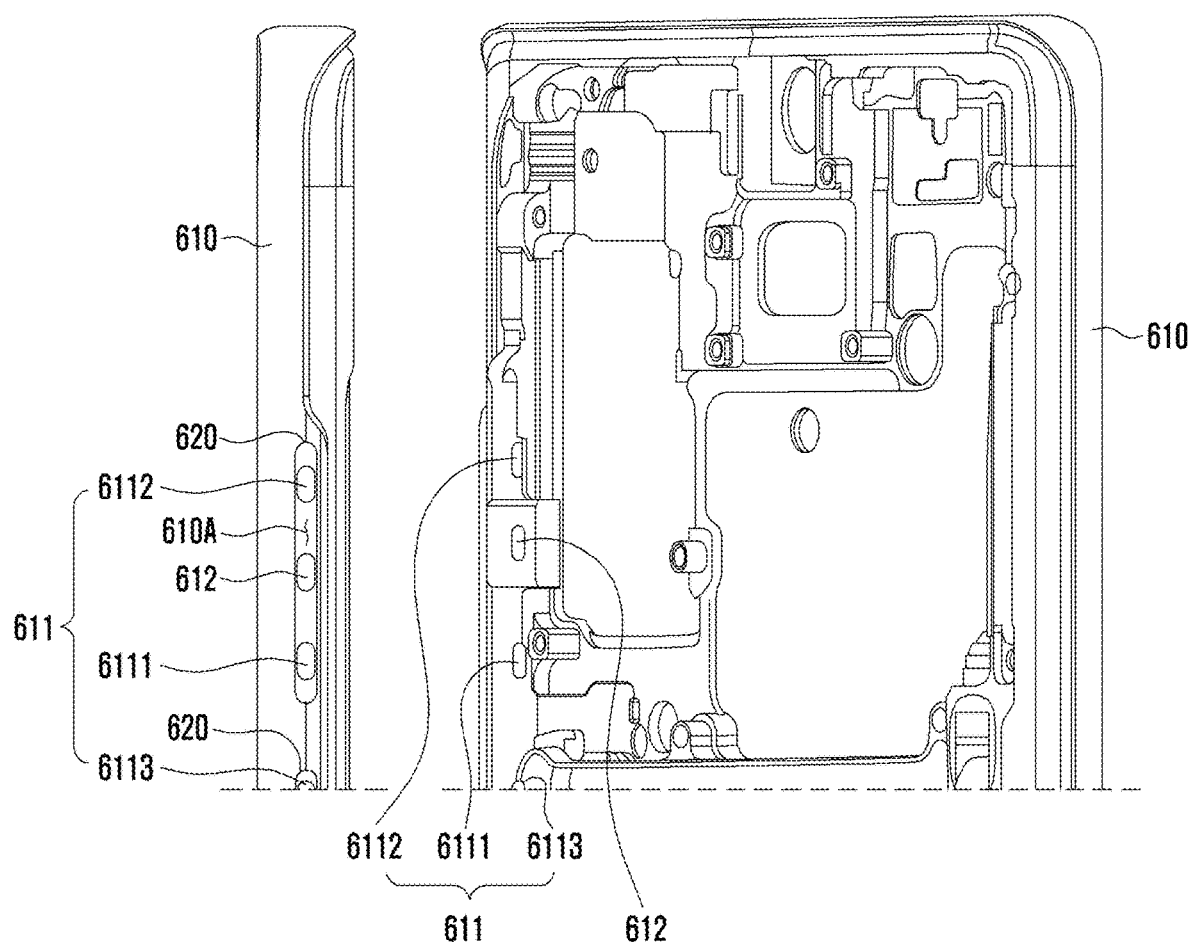
FIG. 7 is a view of a housing of an electronic device according to an embodiment of the disclosure.
Figure 8:
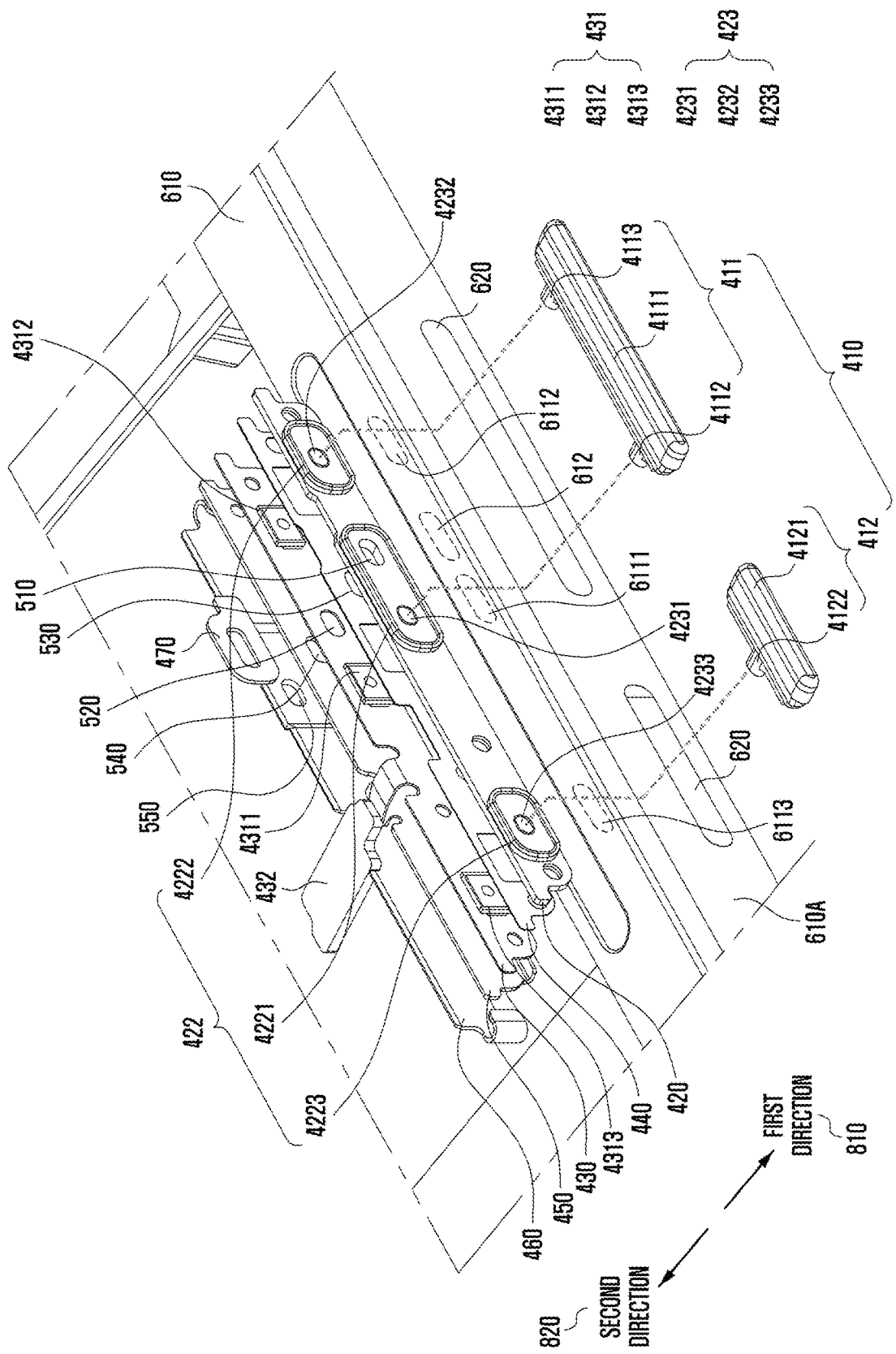
FIG. 8 is a view showing a button device installed in a housing according to an embodiment of the disclosure.

FIG. 6 is a view showing a state in which a button device is installed in a housing of an electronic device according to an embodiment of the disclosure. FIG. 7 is a view of a housing of an electronic device according to an embodiment of the disclosure. FIG. 8 is a view showing a button device installed in a housing according to an embodiment of the disclosure. FIG. 9A is a cross-sectional view taken along line A-A in FIG. 7 according to an embodiment of the disclosure.

Hereinafter, an electronic device, in which the button device 400 described above is installed, will be described. Member reference numbers of elements of the button device 400 will be used as it is the member reference number used in the above-description of the button device 400. In addition, overlapping descriptions of the button device 400 will be omitted.

According to various embodiments, a housing 610 may include a seat part 620 which allows the button device 400 to be installed therein. The seat part 620 may be a recess formed on the housing 610. A button member 410 of the button device 400 may be seated in the seat part 620. In an embodiment, the housing 610 may be formed of two or more materials. For example, the housing 610 may be formed of a combination of a metal material and a synthetic resin material.

Referring to FIG. 8, the button member 410 may be disposed in a first direction 810 with respect to an outer wall 610A of the housing 610, and a button bracket 460 and components (e.g., the waterproof member 420, the adhesive member 440, the substrate member 430, and the substrate bracket 450) coupled to the button bracket 460 may be arranged in a second direction 820 which is a direction opposite to the first direction 810 with respect to the outer wall 610A of the housing 610.

In an embodiment, the button member 410 of the button device 400 may include a first button member 411 and a second button member 412. The first button member 411 and the second button member 412 may be inserted into two holes 631 and 632 formed through the housing 610, respectively.

In an embodiment, a key hole 611 and a vent hole 612 may be formed through the housing 610. A first body part 4111 of the first button member 411 may be formed to have a size capable of covering all of a first key hole 6111 and a second key hole 6112, and the vent hole 612, and may be disposed in the first direction 810 with respect to the outer wall 610A of the housing 610. Referring to FIG. 6, all of the first key hole 6111, the second key hole 6112, and the vent hole 612 may be invisible from the outside of an electronic device. Button protrusions (the first button protrusion 4112, the second button protrusion 4113, the third button protrusion 4122) of the button member 410 may be inserted into the key hole 611. Referring to FIG. 8, in case that three button protrusions 4112, 4113, and 4122 are provided, the number of the key holes 611 may also be three corresponding to the number of the button protrusions 4112, 4113, and 4122. A first button protrusion 4112 may be inserted into the first key hole 6111, a second button protrusion 4113 may be inserted into the second key hole 6112, and a third button protrusion 4122 may be inserted into a third key hole 6113. Referring to FIG. 9A, external air introduced into a space 910 between the housing 610 and the button member 410 may pass through the vent hole 612. The space 910 between the housing 610 and the button member 410 may be a space intentionally formed by adjusting the size of the button member 410, and may be a space naturally formed due to tolerance during manufacturing.

According to various embodiments, a waterproof member 420 may be disposed in the second direction 820 with respect to the outer wall 610A of the housing 610. The waterproof member 420 may be disposed between a substrate member 430 and the button member 410. A sealing part of the waterproof member 420 may include a first sealing part 4221 surrounding the first key hole 6111 and vent hole 612, a second sealing part 4222 surrounding the second key hole 6112, and a third sealing part 4223 surrounding the third key hole 6113. The first sealing part 4221 may be formed to protrude from a base 421 of the waterproof member 420, and at least a portion thereof may be in close contact with the outer wall 610A of the housing 610. The second sealing part 4222 may be formed to protrude from the base 421 of the waterproof member 420, and at least a portion thereof may be in close contact with the outer wall 610A of the housing 610. The third sealing part 4223 may be formed to protrude from the base 421 of the waterproof member 420, and at least a portion thereof may be in close contact with the outer wall 610A of the housing 610. Foreign substances or moisture introduced through the first key hole 6111 or the vent hole 612 may not be moved to other portions by the first sealing part 4221. Foreign substances or moisture introduced through the second key hole 6112 may not be moved to other portions by the second sealing part 4222. Foreign substances or moisture introduced through the third key hole 6113 may not be moved to other portions by the third sealing part 4223.

According to various embodiments, the substrate member 430 may be disposed in the second direction 820 with respect to the outer wall 610A of the housing 610. The substrate member 430 may include a switch 431. As illustrated in FIG. 8, the switch may include a first switch 4311, a second switch 4312, and a third switch 4313 to correspond to three button protrusions (the first button protrusion 4112, the second button protrusion 4113, and the third button protrusion 4122). The first button protrusion 4112 may press the first switch 4311, the second button protrusion 4113 may press the second switch 4312, and the third button protrusion 4122 may press the third switch 4313. In an embodiment, a first delivery part 4231 of the waterproof member 420 may be disposed between the first button protrusion 4112 and the first switch 4311, a second delivery part 4232 thereof may be disposed between the second button protrusion 4113 and the second switch 4312, and a third delivery part 4233 thereof may be disposed between the third button protrusion 4122 and the third switch 4313. In case that the first button protrusion 4112 deforms or moves the first delivery part 4231, the first switch 4311 may be pressed by the deformation or movement of the first delivery part 4231, and in case that the second button protrusion 4113 deforms or moves the second delivery part 4232, the second switch 4312 may be pressed by the deformation or movement of the second delivery part 4232. In case that the third button protrusion 4122 deforms or moves the third delivery part 4233, the third switch 4313 may be pressed by the deformation or movement of the third delivery part 4233. The switch 431 may generate an electrical signal by the pressing. The substrate member 430 and a main substrate of an electronic device may be electrically connected through a connection member 432. An electrical signal generated by the switch 431 may be delivered to the main substrate of the electronic device through the connection member 432.

According to various embodiments, a conduit 500 may be an air movement passage which allows the air outside the electronic device and the air in the inner space of an electronic device to circulate each other. The conduit 500 may include the first opening 510, the second opening 520, the third opening 530, the fourth opening 540, and the fifth opening 550. The conduit 500 may be connected to the vent hole 612.

Referring to FIG. 8, the first opening 510 may be a hole formed through the waterproof member 420 at a position facing the vent hole 612. The second opening 520 may be a hole formed through the substrate member 430 at a position facing the first opening 510. The third opening 530 may be a hole formed through an adhesive member 440 disposed between the waterproof member 420 and the substrate member 430 to be connected to the first opening 510 and the second opening 520. The fourth opening 540 may be a hole formed through a substrate bracket 450 at a position facing the second opening 520. The fifth opening 550 may be a hole formed through the button bracket 460 at a position facing the fourth opening 540.

In an embodiment, external air introduced into a space 910 between the button member 410 and the housing 610 may move to the vent hole 612. External air introduced into the vent hole 612 may be introduced into the electronic device via the first opening 510—the third opening 530—the second opening 520—the fourth opening 540—the fifth opening 550. Internal air of the electronic device may be discharged to the vent hole 612 via the fifth opening 550—the fourth opening 540—the second opening 520—the third opening 530—the first opening 510. Air discharged into the vent hole 612 may be discharged to the outside through the space 910 between the button member 410 and the housing 610. As such, the conduit 500 may be a movement passage of air introduced or discharged through the vent hole 612. A structure in which external air and internal air of an electronic device are circulated through the conduit 500 may be formed. By smooth circulation of the internal air and the external air of an electronic device, internal temperature rise due to heat generation of the electronic device may be suppressed to a predetermined level. In addition, the difference in temperature between the inside and the outside of the electronic device may be reduced, and thus the problem of condensation due to the difference in temperature between the inside and the outside may be reduced.

According to various embodiments, a waterproof cover 470 may be disposed on the conduit 500. The waterproof cover 470 may block external foreign substances or moisture introduced into the conduit 500. The waterproof cover 470 may be formed of a material which allows air to pass therethrough but does not allow moisture or foreign substances to pass therethrough. External foreign substances or moisture may not be introduced into an electronic device by the waterproof cover 470. In an embodiment, as illustrated in FIG. 8 the waterproof cover 470 may be disposed between the fourth opening 540 and the fifth opening 550.

Although it has been described that the button device 400 described above includes three button protrusions (the first button protrusion 4112, the second button protrusion 4113, and the third button protrusion 4122), three delivery parts (the first delivery part 4231, the second delivery part 4232, and the third delivery part 4233), and three switches (the first switch 4311, the second switch 4312, the third switch 4313), the number of the button protrusions, the delivery parts, and the switches may be variously changed. In addition, although the button member 410 has been described as including the first button member 411 and the second button member 412, the number of button members 410 may also be variously changed.

Figure 9B:
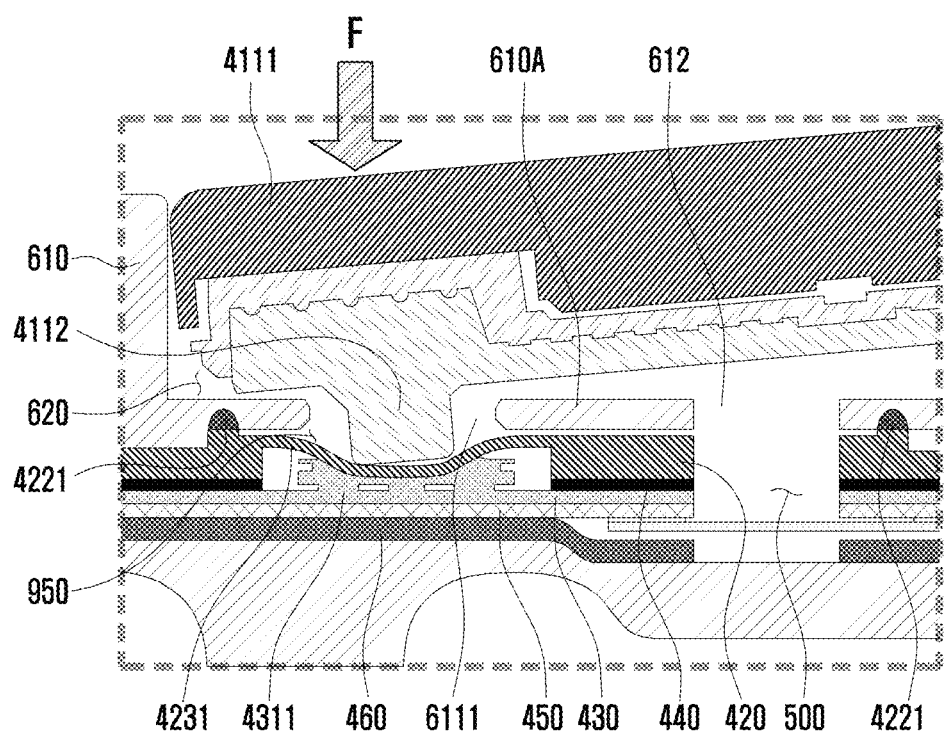
FIG. 9B is a cross-sectional view showing a state in which an external force is applied to a button device according to an embodiment of the disclosure.

FIG. 9B is a cross-sectional view showing a state in which an external force is applied to a button device according to an embodiment of the disclosure.

According to various embodiments, the button device 400 may include a vent space 950 which is a space surrounded by the base 421 and the sealing part 4221 of the waterproof member 420 and the housing 610. A delivery part (e.g., the first delivery part 4231 in FIG. 9B) and a first opening (e.g., the first opening 510 in FIG. 8) may be arranged in the vent space 950.

Referring to FIG. 9B, in case that a button protrusion (e.g., the first button protrusion 4112) enters in the direction, in which the waterproof member 420 is disposed, by an external force F applied to a button member (e.g., the first button member 411), air in the vent space 950 may be pushed out by the entry of the button protrusion 4112. The air pushed out of the vent space 950 may move through several holes (e.g., the first key hole 6111, the vent hole 612, and the conduit 500) existing in the vent space 950.

In this manner, the air in the vent space 950 may be moved by an external force applied to the button member 410 by a user. The flow of air may cause air circulation inside and outside an electronic device to occur more frequently. Whenever a user manipulates the button device 400, a flow of air in the vent space 950 may occur so that internal air and external air are circulated more frequently.

According to various embodiments, an electronic device may include various electronic components (e.g., the elements in FIG. 1). Some of the electronic components may generate heat by an operation thereof. A component, which generates a relatively large amount of heat compared to other electronic components, may be referred to as a heat-generating component. For example, the heat-generating component may include at least one of a processor (e.g., the processor 120 in FIG. 1), a power management module (a power management integrated circuit (PMIC)) (e.g., the power management module 188 in FIG. 1), a communication module (e.g., the communication module 190 in FIG. 1), and a camera module (e.g., the camera module 180 in FIG. 1) of an electronic device.

In case that internal temperature of an electronic device increases due to the heat-generating component, a performance control operation (e.g., throttling) for suppressing the increase in the internal temperature of the electronic device may be performed. However, the performance of an electronic device may be degraded by the performance control operation. In addition, the temperature rise of an electronic device may provide discomfort to a user, and in some cases, may also damage the body of the user such as low-temperature burns. In order to control the temperature rise inside an electronic device, air circulation inside and outside the electronic device is required to be smoothly carried out.

The electronic device according to various embodiments disclosed in the document may be configured such that external air and internal air are circulated through the button device 400 capable of circulating air inside and outside the electronic device.

According to various embodiments, the heat-generating component of an electronic device may be disposed at a position adjacent to a portion at which the button device 400 is disposed. For example, referring to FIG. 6, the heat-generating component may be disposed in an area (e.g., the area P in FIG. 6) adjacent to a surface 610A among surfaces (610A, 610B, and 610C) of the housing, on which the seat part 620 is formed. For example, a camera (e.g., the camera 390 in FIG. 3) of an electronic device may be disposed in a portion adjacent to the button device 400. In case that the temperature is increased by the heat-generating component, the internal pressure of an electronic device may increase. The internal pressure may become greater than the pressure of the outside of the electronic device, which has a relatively low temperature. Due to this, the internal air thereof may be naturally discharged to the outside. Since internal air is discharged to the outside through the conduit 500 of the button device 400, in case that the heat-generating component corresponding to a heat-generating source is disposed at a position adjacent to the seat part 620 in which the button device 400 is installed, the air having an increased temperature may be smoothly discharged to the outside of the electronic device through the button device 400, by the heat-generating component.

Air inside and outside an electronic device may circulate through the conduit 500 according to various embodiments disclosed in the document, and thus the condensation phenomenon or the allophone phenomenon due to the difference in temperature between the inside and the outside of the electronic device may be prevented.

Meanwhile, as described above, the button member 410 of the button device 400 may be formed to cover the key hole 611 and the vent hole 612 formed through the housing 610. Since the key hole 611 and the vent hole 612 are not visible from the outside of the electronic device, aesthetic functions provided by an electronic device may be increased.

The electronic device according to various embodiments disclosed in the document may be configured such that the vent hole 612 is covered by the button member 410 and thus is not visibly recognized from the outside, and thus may prevent confusion between a hole for universal subscriber identity module (USIM) removal and the vent hole.

Figure 11B:
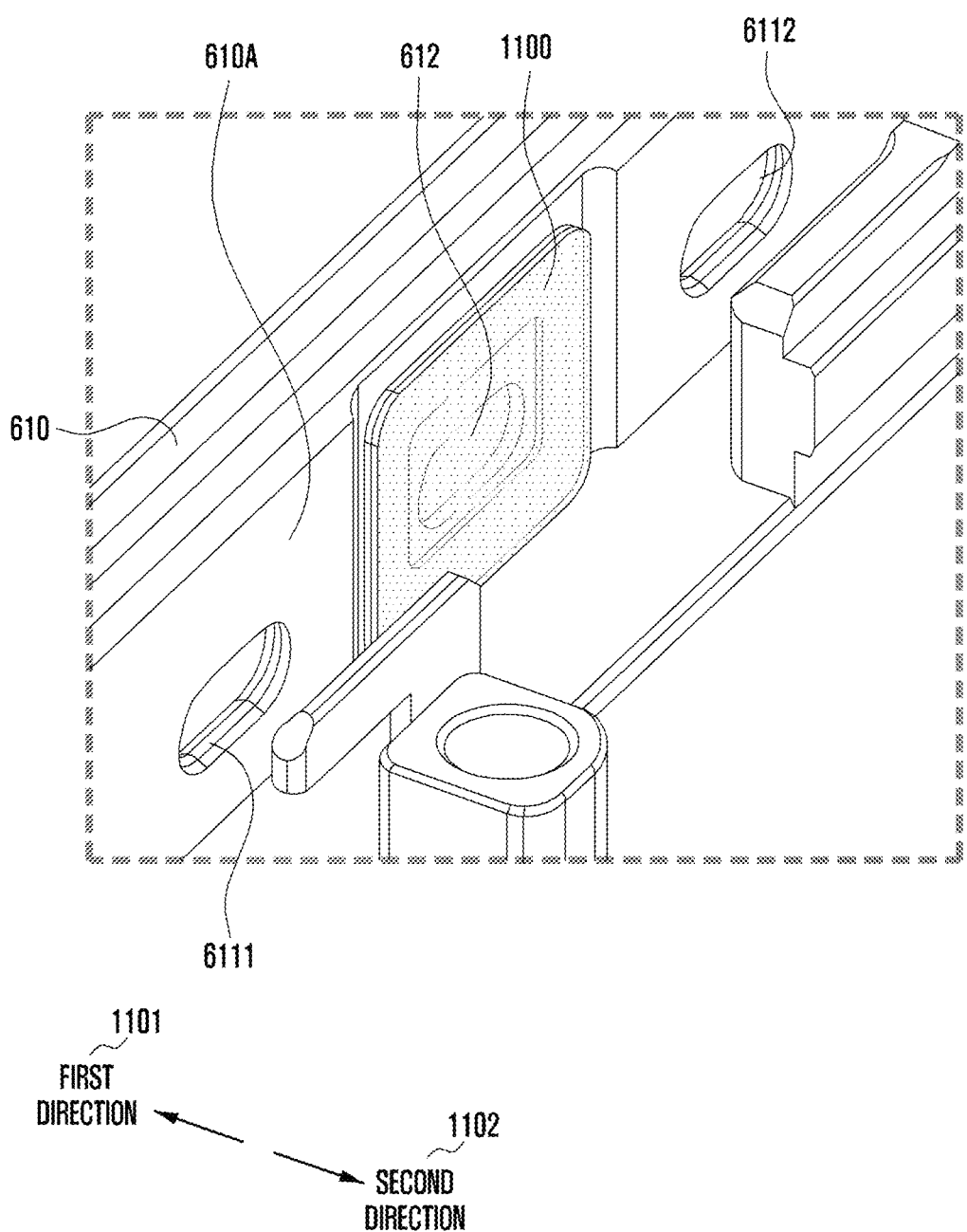
Figure 12:
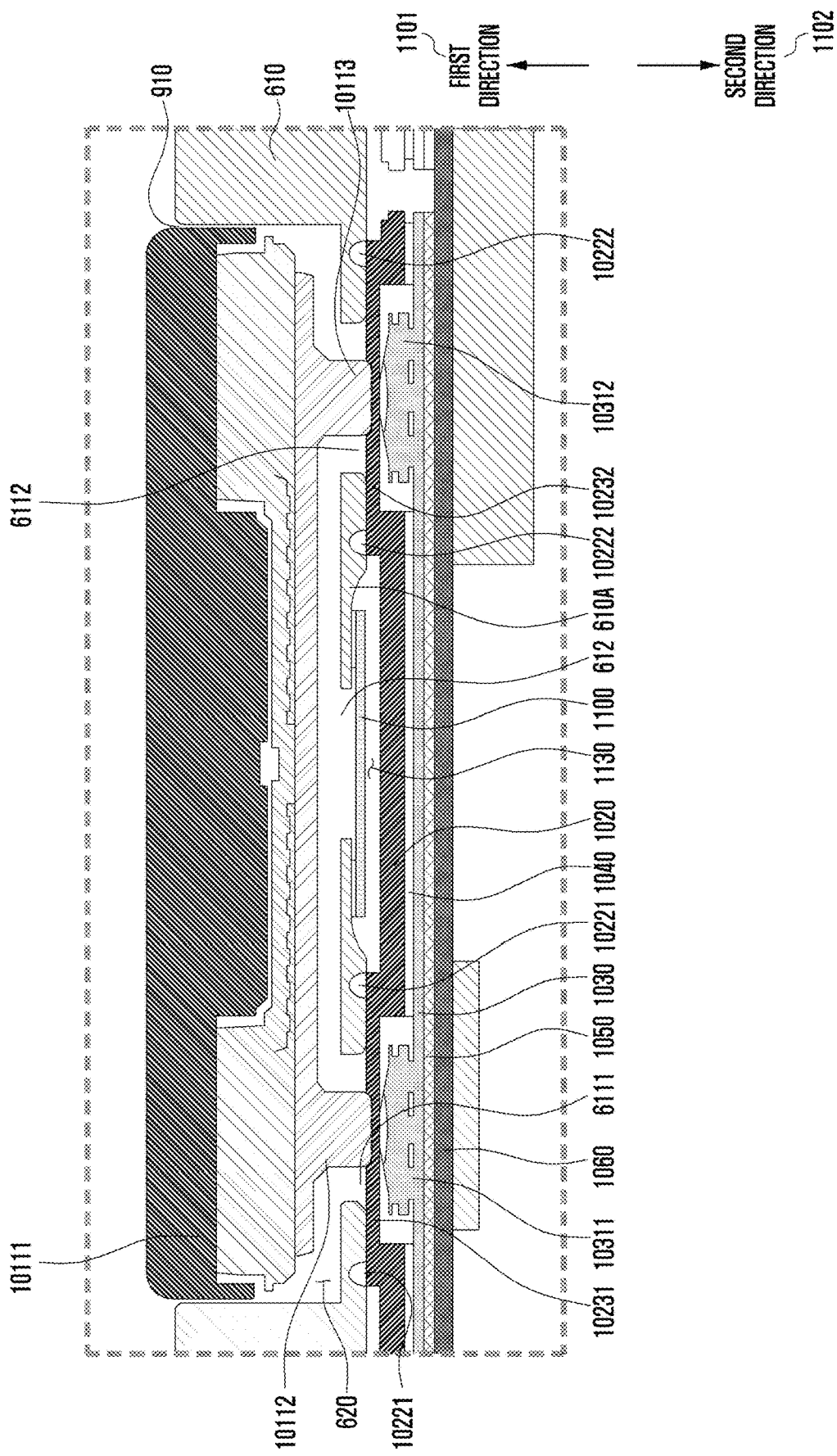
FIG. 12 is a cross-sectional view of a button device according to an embodiment of the disclosure.

FIG. 10 is an exploded perspective view of a button device according to an embodiment of the disclosure. FIGS. 11A, 11B, and 11C are views showing a conduit of a button device according to various embodiments of the disclosure. FIG. 12 is a cross-sectional view of a button device according to an embodiment of the disclosure.

Referring to FIGS. 10, 11A, 11B, 11C, and 12, the button device 400 of the previously described embodiment and the button device 1000 of another embodiment will be described. In relation to the button device 1000 to be described below, detailed descriptions of a configuration similar to the button device 400 described above will be omitted, and different configurations therebetween will be mainly described.

Referring to FIGS. 10 and 12, a button device 1000 of the embodiment may include a button member 1010, a waterproof member 1020, an adhesive member 1040, a substrate member 1030, a substrate bracket 1050, and a button bracket 1060.

Differently from the button device 400 previously described through FIG. 4, the button device 1000 of the embodiment may not include the first opening 510, the second opening 520, the third opening 530, the fourth opening 540, and the fifth opening 550. For example, a waterproof member 1020 may not include the first opening 510, a substrate member 1030 may not include the second opening 520, an adhesive member 1040 may not include the third opening 530, a substrate bracket 1050 may not include the fourth opening 540, and a button bracket 1060 may not include the fifth opening 550.

Referring to FIGS. 10 and 12, the button member 1010 of the button device 1000 may be disposed in a first direction 1101 with respect to a seat part 620. In the button device 1000, the remaining elements except for the button member 1010 may be arranged in a second direction 1102 corresponding to a direction opposite to the first direction 1101 with respect to the seat part 620.

According to various embodiments, a key hole 611 and a vent hole 612 may be formed through a housing 610.

In an embodiment, the key hole 611 may include a first key hole 6111, a second key hole 6112, and a third key hole (not shown). A first button protrusion 10112 may be inserted into the first key hole 6111, a second button protrusion 10113 may be inserted into the second key hole 6112, and a third button protrusion 10122 may be inserted into the third key hole (not shown).

The vent hole 612 may be a hole for circulation of internal air and external air of an electronic device. A first body part 10111 of a first button member 1011 may be formed to cover all of the first key hole 6111 and the second key hole 6112, and the vent hole 612. A second body part 10121 of a second button member 1012 may be formed to cover the third key hole (not shown). Therefore, as illustrated in FIG. 6, the key hole 611 and the vent 612 may not be visibly recognized from the outside of an electronic device.

The substrate member 1030 may include a connection member 1032 to be connected to a main substrate (e.g., the substrate 340 in FIG. 3) of an electronic device. For example, the connection member 1032 may be a flexible printed circuit board. The connection member 1032 may have one end connected to the substrate member 1030, and the other end connected to a main substrate of an electronic device. An electrical signal generated by the switch 1031 may be delivered to a main substrate of an electronic device through the connection member 1032.

Referring to FIGS. 11A to 11C, a waterproof cover 1100 may be disposed to cover the vent hole 612 in a second direction 1102 with respect to an outer wall 610A of the housing 610. The waterproof cover 1100 may be formed of a material which blocks the inflow of external foreign substances or moisture but does not block the movement of air. For example, the waterproof cover 1100 may be made of a Gore-Tex material. The entry of foreign substances or moisture may not be permitted, and the entry of air may be permitted, through the vent hole 612 by the waterproof cover 1100. Referring to FIG. 12, the waterproof cover 1100 may be disposed between the outer wall 610A of the housing 610 and the waterproof member 1020.

According to various embodiments, a base 1021 of the waterproof member 1020 may cover the substrate member 1030. A delivery part 1023 of the waterproof member 1020 may be positioned at a portion corresponding to the switch 1031 of the substrate member 1030. A sealing part 1022 may be formed to surround the key hole. The sealing part 1022 may be formed to protrude from the base 1021 of the waterproof member 1020, and at least a part thereof may be in close contact with the seat part 620. The sealing part 1022 may include a first sealing part 10221, a second sealing part 10222, and a third sealing part 10223. The first sealing part 10221 may protrude from the base 1021 so as to surround the first key hole 6111, and thus a part thereof may be in close contact with the seat part 620. The second sealing part 10222 may protrude from the base 1021 so as to surround the second key hole 6112, and thus a part thereof may be in close contact with the seat part 620. The third sealing part 10223 may protrude from the base 1021 so as to surround the third key hole 6113, and thus a part thereof may be in close contact with the seat part 620. The waterproof member 1020 may include the delivery part 1023 which is in contact with the button protrusions 10112, 10113, and 10122 and is deformed by the button protrusions 10112, 10113, and 10122. The delivery part 1023 may include a first delivery part 10231, a second delivery part 10232, and a third delivery part 10233. The first delivery part 10231 may be in contact with the first button protrusion 10112, the second delivery part 10232 may be in contact with the second button protrusion 10113, and the third delivery part 10233 may be in contact with the third button protrusion 10122.

According to various embodiments, the substrate member 1030 may be bonded to the waterproof member 1020 by the adhesive member 1040. The substrate member 1030 may include a switch 1031. In case that the delivery part 1023 is deformed or moved by the button protrusions 10112, 10113, and 10122 by an external force applied to the button member 1010, the deformation or movement of the delivery part 1023 is delivered to the switch 1031 in contact with the delivery part 1023, so that the switch 1031 is pressed. An electrical signal may be generated as the switch 1031 is pressed, and accordingly, a preset function may be performed. In an embodiment, the first button protrusion 10112 may press the first switch 10311, the second button protrusion 10113 may press the second switch 10312, and the third button protrusion 10122 may press the third switch 10313.

According to various embodiments, the substrate bracket 1050 may support the substrate member 1030. In an embodiment, by a clip 1051 formed on a part of the outer circumferential surface of the substrate bracket 1050, the substrate member 1030 may be coupled to substrate bracket 1050. In addition, the button bracket 1060 may entirely support the waterproof member 1020, the adhesive member 1040, the substrate member 1030, and the substrate bracket 1050. In an embodiment, by a clip 1061 formed on a part of the outer circumferential surface of the button bracket 1060, the button device 1000 may be installed in an electronic device. The clip 1061 illustrated in FIG. 10 may be merely one of various methods of installing the button device 1000 in an electronic device. For example, the button device 1000 may be installed in an electronic device through various fixation structures such as a screw, a pin, and a rivet. In an embodiment, by a fixation part (not shown) formed on the button bracket 1060, the waterproof member 1020, the adhesive member 1040, the substrate member 1030, and the substrate bracket 1050 may be coupled to the button bracket 1060. As the button bracket 1060 is installed in a housing of an electronic device, the button device 1000 may be installed in the electronic device.

According to various embodiments, a conduit 1130 may connect an inner space of an electronic device and the outside of the electronic device through the vent hole 612. Referring to FIG. 11C, in the embodiment, the conduit 1130 may be a space provided between the housing 610 and the waterproof member 1020. The space between the housing 610 and the waterproof member 1020 may be connected to the inner space of the electronic device. Air introduced through the space between the button member 1010 and the housing 610 may pass through the vent hole 612. Air having passed through the vent hole 612 may be introduced into the inner space of the electronic device through the conduit 1130 provided between the housing 610 and the waterproof member 1020. Internal air of the electronic device may move to the vent hole 612 through the conduit 1130. Air having passed through the vent hole 612 may be discharged to the outside of the electronic device through the space between the button member 1010 and the housing 610.

Internal air and external air of the electronic device may be circulated by the vent hole 612 and the conduit 1130 connected to the vent hole 612. By such circulation, the difference in temperature between the inside and the outside of the electronic device may be reduced so that the problem in condensation due to the difference in temperature therebetween is reduced. Therefore, internal temperature rise of the electronic device can be reduced.

An electronic device (e.g., the electronic device 101 in FIG. 1 or the electronic device 200 in FIG. 2A) according to various embodiments disclosed in the document may include a housing (e.g., the housing 610 in FIG. 6), a key hole (e.g., the key hole 611 in FIG. 7) and a vent hole (e.g., the vent hole 612 in FIG. 7) formed through the housing, a button member (e.g., the first button member 411 and the second button member 412 in FIG. 4) including a body part (e.g., the first body part 4111 and the second body part 4121 in FIG. 4) disposed in a first direction with respect to an outer wall (e.g., the outer wall 610A in FIG. 7) of the housing so as to cover the key hole and the vent hole, and a button protrusion (e.g., the first button protrusion 4112 and the second button protrusion 4113 in FIG. 4) inserted into the key hole, a substrate member (e.g., the substrate member 430 in FIG. 4), disposed to face the outer wall of the housing in a second direction that is opposite to the first direction, and which includes a switch (e.g., the switch 431 in FIG. 4) configured to generate an electrical signal in case that the switch is actuated by the button protrusion of the button member, a waterproof member (e.g., the waterproof member 420 in FIG. 4) including a base (e.g., the base 421 in FIG. 4) disposed between the housing and the substrate member to cover the substrate member, and a sealing part (e.g., the sealing part 422 in FIG. 4), formed to protrude from the base in the second direction so as to surround a perimeter of at least one of the key hole and the vent hole, and which has at least a part in close contact with the outer wall of the housing, a conduit (e.g., the conduit 500 in FIG. 4) configured to connect an inner space of the electronic device to outside of the electronic device through the vent hole, and a waterproof cover (e.g., the waterproof cover 470 in FIG. 4) disposed on the conduit so as to block moisture from being introduced through the vent hole.

In addition, a vent space (e.g., the vent space 950 in FIG. 9B) formed by being surrounded by the base and the sealing part of the waterproof member and the housing may be further included therein, and the air in the vent space may be moved by an external force applied to the button member.

In addition, a heat-generating component configured to generate heat according to an operation thereof may be further included therein, and the heat-generating component may be disposed closer to a surface of the housing on which the button member is disposed than other surfaces of the housing.

In addition, the heat-generating component may include at least one of a processor, a power management integrated circuit (PMIC), a camera module, or a communication module.

In addition, the conduit may include a space (e.g., the space 910 in FIG. 9A) between the button member and the housing.

In addition, the sealing part of the waterproof member may be formed to surround the perimeter of at least one of the key hole or the vent hole.

In addition, the conduit may include a first opening (e.g., the first opening 510 in FIG. 4) formed through the waterproof member at a position facing the vent hole, and a second opening (e.g., the second opening 520 in FIG. 4) formed through the substrate member which is disposed so as to face the first opening.

In addition, an adhesive member (e.g., the adhesive member 440 in FIG. 4) disposed between the substrate member and the waterproof member so as to bond the substrate member and the waterproof member may be further included therein, and the conduit may include a third opening (e.g., the third opening 530 in FIG. 4) formed through the adhesive member so as to be connected to the first opening and the second opening.

In addition, a substrate bracket (e.g., the substrate bracket 450 in FIG. 4) configured to support the substrate member may be further included therein, and the conduit may include a fourth opening (e.g., the fourth opening 540 in FIG. 4) formed through the substrate bracket which is disposed so as to face the third opening.

In addition, a button bracket (e.g., the button bracket 460 in FIG. 4) configured to support the waterproof member, the substrate member, and the substrate bracket may be further included therein, and the conduit may include a fifth opening (e.g., the fifth opening 550 in FIG. 4) formed through the button bracket which is disposed so as to face the fourth opening.

In addition, the waterproof member may be disposed between the fourth opening and the fifth opening of the conduit.

In addition, the sealing part of the waterproof member may be formed to surround the key hole.

In addition, the conduit may include a distant space provided between the housing and the waterproof member to be connected to the inner space of the electronic device.

In addition, the waterproof member may be disposed to cover the vent hole of the housing in the second direction.

A button device (e.g., the button device 400 in FIG. 4) according to various embodiments disclosed in the document may include a button member (e.g., the first button member 411 and the second button member 412 in FIG. 4) including a body part (e.g., the first body part 4111 and the second body part 4121 in FIG. 4) and a button protrusion (e.g., the first button protrusion 4112 and the second button protrusion 4113 in FIG. 4) formed on the body part the body part, a substrate member (e.g., the substrate member 430 in FIG. 4) including a switch (e.g., the switch 431 in FIG. 4) configured to generate an electrical signal in case that the switch is actuated by the button protrusion of the button member, and a second opening (e.g., the second opening 520 in FIG. 4), and a waterproof member (e.g., the waterproof member 420 in FIG. 4) including a base (e.g., the base 421 in FIG. 4) disposed between the button member and the substrate member to cover the substrate member, a delivery part (e.g., the delivery part 423 in FIG. 4) formed on the base to be disposed between the button protrusion (e.g., the first button protrusion 4112 and the second button protrusion 4113 in FIG. 4) of the button member and the switch of the substrate member, a first opening (e.g., the first opening 510 in FIG. 4) formed through the base to be spaced apart from the delivery part and be connected to the second opening of the substrate member, and a sealing part (e.g., the sealing part 422 in FIG. 4) formed to protrude from the base in a direction of the button member so as to surround a perimeter of the first opening and the delivery part. In addition, the button device may include an adhesive member (e.g., the adhesive member 440 in FIG. 4), disposed between the waterproof member and the substrate member to bond the waterproof member to the substrate member and includes a third opening (e.g., the third opening 530 in FIG. 4) connected to the first opening and the second opening, and a substrate bracket (e.g., the substrate bracket 450 in FIG. 4), configured to support the substrate member, which includes a fourth opening (e.g., the fourth opening 540 in FIG. 4) connected to the second opening.

In addition, a button bracket (e.g., the button bracket 460 in FIG. 4), which is configured to support the substrate member and substrate bracket and includes a fifth opening (e.g., the fifth opening 550 in FIG. 4) connected to the fourth opening, may be further included therein.

In addition, a waterproof cover (e.g., the waterproof cover 470 in FIG. 4), which is disposed to close at least one of the first opening to fifth opening, may be further included therein.

In addition, the waterproof cover may be disposed between the fourth opening and the fifth opening.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a housing;
a key hole and a vent hole formed through the housing;
a button member comprising:
  a body part disposed in a first direction with respect to an outer wall of the housing so as to cover the key hole and the vent hole, and
  a button protrusion inserted into the key hole;
a substrate member, disposed to face the outer wall of the housing in a second direction that is opposite to the first direction, which comprises a switch configured to generate an electrical signal in case that the switch is actuated by the button protrusion of the button member;
a waterproof member comprising:
  a base disposed between the housing and the substrate member to cover the substrate member, and
  a sealing part, formed to protrude from the base in the second direction so as to surround a perimeter of at least one of the key hole and the vent hole, which has at least a part in close contact with the outer wall of the housing;
a conduit configured to connect an inner space of the electronic device to outside of the electronic device through the vent hole; and
a waterproof cover disposed on the conduit so as to block moisture from being introduced through the vent hole.
2. The electronic device of claim 1, further comprising:
a vent space formed by being surrounded by the base and the sealing part of the waterproof member and the housing,
wherein air in the vent space is moved by an external force applied to the button member.
3. The electronic device of claim 1, further comprising:
a heat-generating component configured to generate heat according to an operation thereof,
wherein the heat-generating component is disposed closer to a surface of the housing on which the button member is disposed than other surfaces of the housing.
4. The electronic device of claim 3, wherein the heat-generating component comprises at least one of a processor, a power management integrated circuit (PMIC), a camera module, or a communication module.
5. The electronic device of claim 1, wherein the conduit comprises a space between the button member and the housing.
6. The electronic device of claim 1, wherein the sealing part of the waterproof member is formed to surround the perimeter of at least one of the key hole or the vent hole.
7. The electronic device of claim 6, wherein the conduit comprises:
a first opening formed through the waterproof member at a position facing the vent hole; and
a second opening, formed through the substrate member which is disposed so as to face the first opening.
8. The electronic device of claim 7, further comprising:
an adhesive member disposed between the substrate member and the waterproof member so as to bond the substrate member and the waterproof member,
wherein the conduit comprises a third opening formed through the adhesive member so as to be connected to the first opening and the second opening.
9. The electronic device of claim 8, further comprising:
a substrate bracket configured to support the substrate member,
wherein the conduit comprises a fourth opening formed through the substrate bracket that is disposed so as to face the third opening.
10. The electronic device of claim 9, further comprising:
a button bracket configured to support the waterproof member, the substrate member, and the substrate bracket,
wherein the conduit comprises a fifth opening formed through the button bracket that is disposed so as to face the fourth opening.
11. The electronic device of claim 10, wherein the waterproof cover is disposed between the fourth opening and the fifth opening of the conduit.
12. The electronic device of claim 1, wherein the sealing part of the waterproof member is formed to surround the key hole.
13. The electronic device of claim 12, wherein the conduit comprises a distant space provided between the housing and the waterproof member to be connected to the inner space of the electronic device.
14. The electronic device of claim 12, wherein the waterproof cover is disposed to cover the vent hole of the housing in the second direction.
15. A button device comprising:
a button member comprising:
  a body part, and
  a button protrusion formed on the body part;
a substrate member comprising:
  a switch configured to generate an electrical signal in case that the switch is actuated by the button protrusion of the button member, and
  a second opening;
a waterproof member comprising:

a base disposed between the button member and the substrate member to cover the substrate member, a delivery part formed on the base to be disposed between the button protrusion of the button member and the switch of the substrate member, a first opening formed through the base to be spaced apart from the delivery part and be connected to the second opening of the substrate member, and a sealing part formed to protrude from the base in a direction of the button member so as to surround a perimeter of the first opening and the delivery part;

an adhesive member, disposed between the waterproof member and the substrate member to bond the waterproof member to the substrate member, which comprises a third opening connected to the first opening and the second opening; and a substrate bracket which is configured to support the substrate member and comprises a fourth opening connected to the second opening.

16. The button device of claim 15, further comprising:

a button bracket configured to support the substrate member and the substrate bracket, wherein the button bracket includes a fifth opening connected to the fourth opening.

17. The button device of claim 16, further comprising:

a waterproof cover disposed to close at least one of the first opening, the second opening, the third opening, the fourth opening, or the fifth opening.

18. The button device of claim 17, wherein the waterproof cover is disposed between the fourth opening and the fifth opening.

* * * * *